United States Patent
Nagatomo et al.

(10) Patent No.: US 7,633,350 B2
(45) Date of Patent: Dec. 15, 2009

(54) FUNCTION GENERATION CIRCUIT

(75) Inventors: Kei Nagatomo, Kanagawa (JP); Hisato Takeuchi, Kanagawa (JP); Keigo Shingu, Tokyo (JP)

(73) Assignee: Panasonic Corporation, Osaka (JP)

( * ) Notice: Subject to any disclaimer, the term of this patent is extended or adjusted under 35 U.S.C. 154(b) by 228 days.

(21) Appl. No.: 11/806,300

(22) Filed: May 31, 2007

(65) Prior Publication Data

US 2008/0007363 A1   Jan. 10, 2008

(30) Foreign Application Priority Data

Jun. 1, 2006   (JP)   .................. P. 2006-153962

(51) Int. Cl.
*H03L 1/00*   (2006.01)
(52) U.S. Cl. .................. 331/176; 331/66; 331/116 R; 331/158
(58) Field of Classification Search .................. 331/66, 331/158, 116 R, 176
See application file for complete search history.

(56) References Cited

U.S. PATENT DOCUMENTS

| | | | |
|---|---|---|---|
| 5,705,957 A * | 1/1998 | Oka et al. | .................. 331/66 |
| 6,292,066 B1 * | 9/2001 | Shibuya et al. | .............. 331/176 |
| 2002/0158700 A1 * | 10/2002 | Nemoto | ...................... 331/158 |
| 2004/0183609 A1 * | 9/2004 | Shingu et al. | ............... 331/176 |
| 2005/0225405 A1 | 10/2005 | Tateyama | |
| 2006/0132254 A1 * | 6/2006 | Routama et al. | ............ 331/176 |
| 2006/0152294 A1 * | 7/2006 | Kawasaki et al. | ........... 331/176 |

FOREIGN PATENT DOCUMENTS

| | | |
|---|---|---|
| EP | 1 587 211 A1 | 10/2005 |
| JP | 6-276020 | 9/1994 |
| JP | 8-288741 | 11/1996 |
| JP | 9-266409 | 10/1997 |
| JP | 2001-244743 | 9/2001 |
| JP | 2003-051717 | 2/2003 |
| JP | 2003-273646 | 9/2003 |
| JP | 2004-304225 | 10/2004 |
| JP | 2005-124022 | 5/2005 |
| JP | 2005-347929 | 12/2005 |
| WO | WO 2004/079895 A1 | 9/2004 |

* cited by examiner

*Primary Examiner*—Joseph Chang
*Assistant Examiner*—Jeffrey Shin
(74) *Attorney, Agent, or Firm*—McDermott Will & Emery LLP

(57) ABSTRACT

A first order function generation circuit receives a signal from a temperature sensor circuit, and generates a first order function control signal V1 that is affected by the ambient temperature. A fourth order and fifth order approximation function generation circuit receives signals from the temperature sensor circuit and from the third order approximation function generation circuit, and generates a fourth and fifth order approximation function control signal V45 that is affected by the ambient temperature. A peak change point adjustment circuit outputs a signal to adjust the value of a peak change point temperature Ti for the third order approximation function generation circuit, the first order generation function circuit and the fourth order and fifth order approximation function generation circuit. A temperature compensation circuit adds together control signals V0, V1, V3 and V5, and outputs the resultant signal Vc.

17 Claims, 21 Drawing Sheets

$\Delta Vc = Vc -$ IDEAL THIRD ORDER CUBIC CURVE $\Delta f = f - f0$

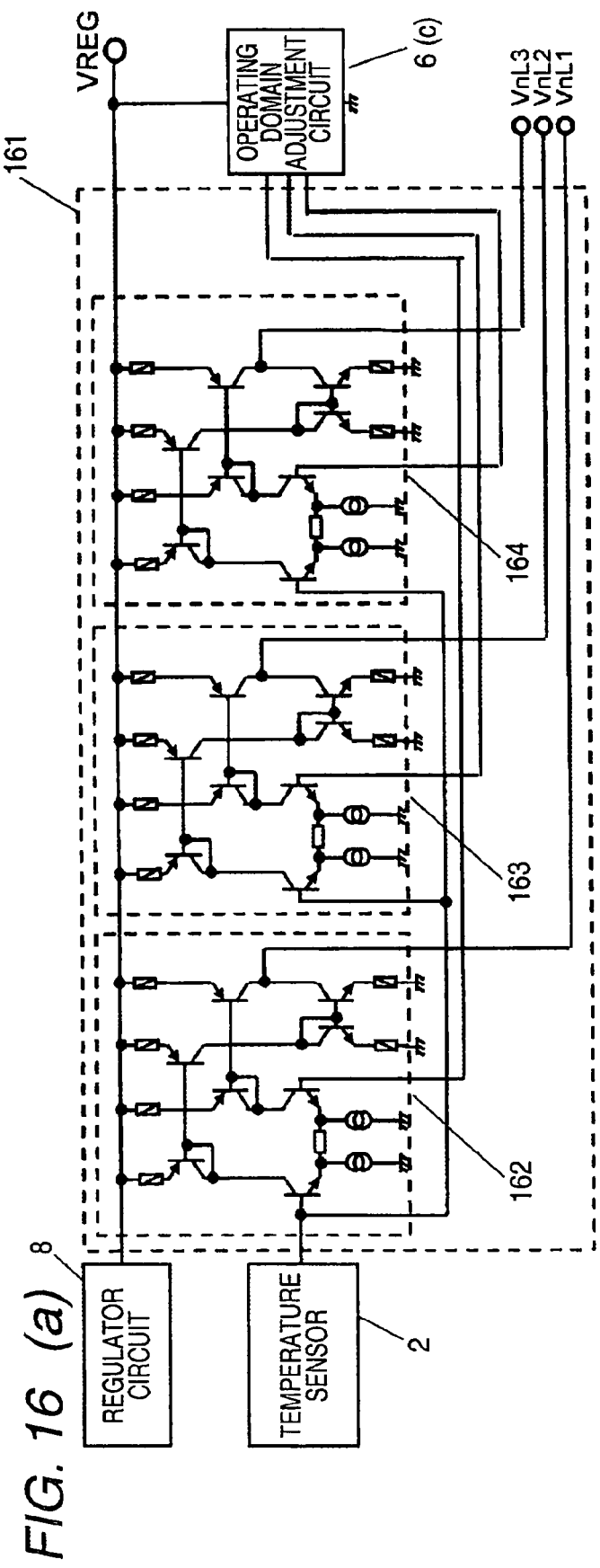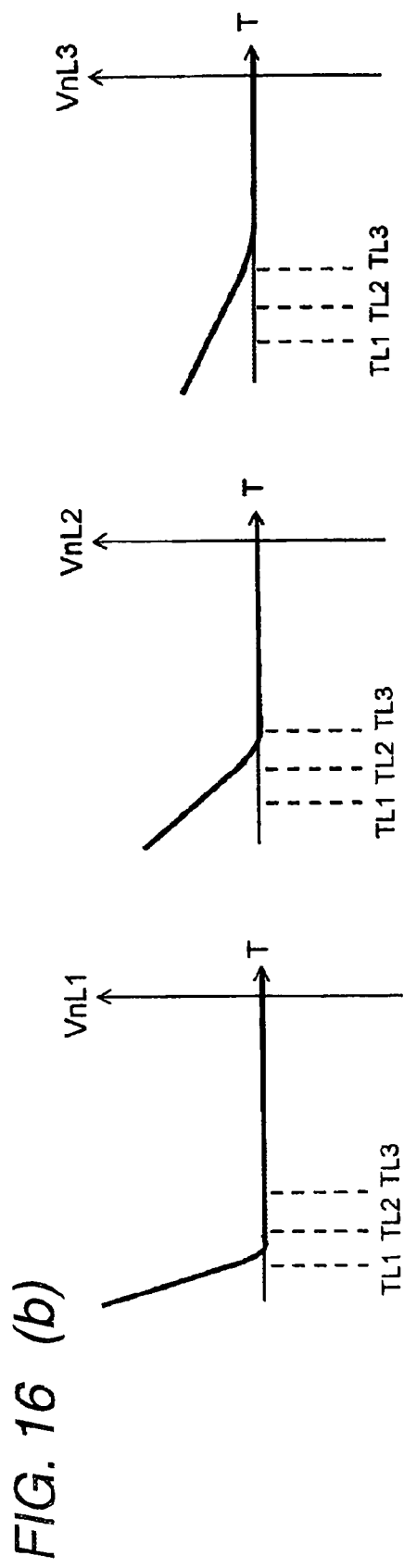
FIG. 16 (a)
FIG. 16 (b)

FUNCTION GENERATION CIRCUIT

BACKGROUND OF THE INVENTION

1. Field of the Invention

The present invention relates to a function generation circuit, employed for a temperature-compensating quartz oscillation circuit that employs a quartz oscillation frequency, an electronic apparatus and a communication apparatus.

2. Description of the Related Art

Recently, the demand for portable electronic apparatuses has increased remarkably, and for such electronic apparatuses, compact, accurate quartz oscillators that generate reference clock signals are requisites.

As the temperature characteristics, the oscillation frequency of a quartz oscillator included in a quartz oscillation apparatus has the third and first order temperature elements due to a crystal unit that is employed for a quartz oscillator. Specifically, when as shown in FIG. 17A the horizontal axis represents an ambient temperature Ta and the vertical axis represents an oscillation frequency f, the characteristic of the oscillation frequency f of the quartz oscillator when temperature compensation is not performed is substantially as shown by a cubic curve 101A, where there is a shift of about 10 ppm to 30 ppm between a relative maximum value and a relative minimum value. In this case, the ambient temperature Ta is defined as being about −30° C. to +80° C. Therefore, when as shown in FIG. 17B the horizontal axis represents the ambient temperature Ta and the vertical axis represents a control voltage Vc, an ideal control voltage curve 102A is generated. And when as shown in FIG. 17C a voltage is applied to the quartz oscillator, df/dTa=0 is obtained, and the oscillation frequency f does not substantially depend on the temperature.

Presently available is an example temperature compensation method whereby a varactor diode (=a variable capacitance diode), which is a frequency adjustment element, is connected to a quartz oscillator, and whereby, to stabilize an oscillation frequency, a control voltage having the third and the first temperature characteristics, for compensating for the temperature characteristic of the quartz oscillator, is applied to the varactor diode.

Actually, it is technically difficult to generate a control voltage Vc having the ideal temperature characteristic shown in FIG. 17B, and generally, a control voltage having a pseudo third temperature characteristic is generated, by employing various methods, in order to provide temperature compensation for the quartz oscillation apparatus.

FIG. 18 is a block diagram showing the configuration of a conventional quartz oscillation apparatus that includes a temperature compensation function. According to the temperature compensation method of this quartz oscillation apparatus, the third and first temperature characteristics of a quartz oscillator are both divided to obtain a plurality of temperature domains, and for each temperature domain, a crossover approximation is obtained by employing, as a linear temperature line, a voltage level that serves as a temperature function.

Specifically, for the individual voltage line areas, the temperature domains obtained by dividing the temperature characteristics, the temperature coefficients (factors of proportionality) of linear temperature lines in the temperature domains, and voltage values at the normal temperature along the linear temperature line are stored in a memory circuit 111A shown in FIG. 18, and voltage line data corresponding to an ambient temperature detected by a temperature sensor circuit 112A is selectively read from the memory circuit 111A. An amplification circuit 113A generates a predetermined control voltage based on the control voltage data that is read, and applies the generated control voltage to a voltage-controlled quartz oscillator 114A. In this manner, temperature compensation for the quartz oscillation apparatus is provided, and the oscillation frequency is stabilized.

Patent Document 1: JP-A-8-288741

However, since the conventional quartz oscillation apparatus equipped with a temperature compensation function employs A/D conversion to obtain a crossover approximation for generation of a control voltage used for temperature compensation, a quantized noise occurs, and essentially, a frequency skipping problem can not be avoided. Further, since a clock signal generation circuit is required, there is a problem with the mixing of clock noise, and a problem in that, when power is on, it takes time for an oscillated frequency to be stabilized because of a time constant for a sample holding circuit 115A.

Furthermore, in a process for measuring and adjusting a temperature characteristic, the temperature characteristic of a frequency oscillated by a quartz oscillation apparatus is measured by discretely changing the ambient temperature, and temperature compensation for the quartz oscillation apparatus is performed. Therefore, an adjustment error occurs. In order to reduce this error, the number of domains obtained by dividing the temperature characteristic must be increased; however, in this case, the memory volume of the memory circuit 111A is increased.

While taking these problems into account, one objective of the present invention is to provide a function generation circuit that enables the attainment of an accurate TCXO (temperature-controlled quartz oscillator), for which the basic frequency fluctuation error is ±0.5 ppm within a large temperature domain.

SUMMARY OF THE INVENTION

Another objective of the present invention is to provide a function generation circuit that enables a temperature compensation circuit to perform compensation for a temperature, including the temperature characteristic of a voltage control oscillation circuit and the temperature characteristic of a crystal unit.

According to a first aspect of the present invention, a function generation circuit, which performs temperature compensation for a quartz oscillation apparatus, comprises:

a first analog signal generation circuit, for generating and outputting a predetermined analog signal that is not affected by an ambient temperature;

a second analog signal generation circuit, for generating and outputting an analog signal that is affected by the ambient temperature and that approximates a first order function;

a third order approximation function generation circuit, for receiving the analog signals from the first analog signal generation circuit and the second analog signal generation circuit, and for generating and outputting m control signals (m is an integer of three or greater) corresponding to m contiguous temperature domains that are obtained by dividing a range, available for the ambient temperature, extending from a low temperature side to a high temperature side;

a first order function generation circuit, for receiving the analog signal from the second analog signal generation circuit and generating a first-order function control signal that is affected by the ambient temperature;

a zero-th order function generation circuit, for receiving the analog signal generation circuit from the first analog signal generation circuit and generating a zero-th order function control signal that is not affected by the ambient temperature;

a peak change point adjustment circuit, for receiving the analog signal from the second analog signal generation circuit and for adjusting a temperature at a peak change point and outputting the result to the third order approximation function generation circuit and the first order function generation circuit;

a fourth order and fifth order approximation function generation circuit, for employing a g-th control signal (g is an integer of one or greater and m or smaller) and a h-th control signal (h is an integer, other than g, of one or greater and m or smaller), both of which are output by the third order approximation function generation circuit in consonance with a g-th temperature domain and an h-th temperature domain, respectively, and generating control signals that approximate a fourth order function and a fifth order function; and an adder, for synthesizing the signal output by the third order approximation function generation circuit, the analog signal output by the first order function generation circuit, the zero-th order function control signal output by the zero-th order function generation circuit, and the control signals output by the fourth order and the fifth order approximation function generation circuit, and outputting the resultant signal.

For the generation of a control signal consonant with a specific operating temperature domain, only a predetermined output level for the output of a constant voltage circuit must be designated to set the specific operating temperature domain, because an analog signal output by a temperature sensor carries the first temperature characteristic.

According to the arrangement of the first aspect of the invention, the signal output by the third order approximation function generation circuit includes a temperature characteristic that approximates the third order function below.

$$V_3 = A(T-Ti)^3 + B(T-Ti) + C \quad \text{[Ex. 1]}$$

In this expression (1), $V_3$ denotes a control signal output by the third order approximation function generation circuit, T denotes an ambient temperature, A denotes a third order coefficient, B denotes a first order coefficient, C denotes a zero-th order coefficient, and Ti denotes the peak change point of the function $V_3$. Further, the third order approximation function generation circuit is connected to a PROM circuit 13, shown in FIG. 1, that will be described later, and can adjust temperature compensation parameters A and B.

According to the arrangement of the first aspect of the invention, the third order approximation function generation circuit can generate control signals by dividing the range into the first to the m-th temperature domain. Therefore, since the number of temperature domains m is increased, control signals can be generated by accurately performing the third order function approximation within a broad temperature area.

A signal output by the fourth order and fifth order approximation function generation circuit has a temperature characteristic that approximates the fifth order function below.

$$V_{45} = D(T-Ti)^5 + E(T-Ti)^4 \quad \text{[Ex. 2]}$$

In this expression (2), $V_{45}$ denotes a control signal output by the fourth order and fifth order approximation function generation circuit, T denotes an ambient temperature, D denotes a fifth order coefficient, E denotes a fourth order coefficient, and Ti denotes the peak change points of the functions $V_{45}$ and $V_3$. Further, the fourth order and fifth order approximation function generation circuit is connected to the PROM circuit 13, shown in FIG. 1, that will be described later, and can adjust temperature compensation parameters D and E.

According to the arrangement of the first aspect of the invention, the fourth order and fifth order approximation function generation circuit employs the g-th control signal and the h-th control signal, both of which are output by the third order approximation function generation circuit in consonance with the g-th temperature range and the h-th temperature range, respectively. Therefore, the peak change point used by the fourth order and the fifth order approximation function generation circuit can be adjusted, in common, by the peak change point adjustment circuit, and the increase in the circuit size can be prevented.

In this case, g represents a low temperature domain, and is a value of one or greater and m or smaller. h represents a high temperature domain, and is a value of one or greater and m or smaller. Furthermore, temperature domains other than the g-th temperature domain and the h-th temperature domain, i.e., the (g+1)-th temperature domain to the (h−1)-th temperature domain, are not affected by the fourth order and fifth order approximation function generation circuit, and noise in the second temperature domain to the (m−1)-th temperature domain is the same as when the fourth order and fifth order approximation function generation circuit is not present.

According to a second aspect of the present invention, a function generation circuit, which performs temperature compensation for a quartz oscillation apparatus, comprises:

a first analog signal generation circuit, for generating and outputting a predetermined analog signal that is not affected by an ambient temperature;

a second analog signal generation circuit, for generating and outputting an analog signal that is affected by the ambient temperature and is to approximate a first order function;

a third order approximation function generation circuit, for receiving analog signals from the first analog signal generation circuit and the second analog signal generation circuit, and for outputting a signal;

a first order function generation circuit, for receiving the analog signal from the second analog signal generation circuit, and generating a first order function control signal that is affected by the ambient temperature;

a zero-th order function generation circuit, for receiving the analog signal generation circuit from the first analog signal generation circuit and generating a zero-th order function control signal that is not affected by the ambient temperature;

a first peak change point adjustment circuit, for receiving the analog signal from the second analog signal generation circuit and adjusting a temperature at a peak change point, and for outputting the result to the third order approximation function generation circuit and the first order function generation circuit;

a low temperature operating domain adjustment circuit, for receiving the analog signal from the second analog signal generation circuit, and for adjusting an operating temperature domain for a low temperature domain control circuit that outputs a low temperature domain control signal corresponding to a low temperature domain;

a high temperature operating domain adjustment circuit, for adjusting an operating temperature domain for a high temperature domain control circuit that outputs a high temperature domain control signal corresponding to a high temperature domain;

an n-th order function approximation function generation circuit, for receiving signals from the low temperature operating domain adjustment circuit, the high temperature operating domain adjustment circuit and the second analog signal generation circuit, and for generating and outputting the low temperature domain control signal corresponding to a low temperature domain and the high temperature domain control signal corresponding to a high temperature domain;

a second peak change point adjustment circuit, for receiving the analog signal from the second analog signal generation circuit, adjusting a temperature at a peak change point and outputting a signal to the n-th order approximation function generation circuit; and an adder, for synthesizing the signals output by the third order approximation function generation circuit, the first order function generation circuit, the zero-th order function generation circuit and the n-th order approximation function generation circuit.

According to the arrangement of the second aspect of the invention, the signal output by the third order approximation function generation circuit includes a temperature characteristic as shown in expression (1). Further, according to the second aspect of the invention, since the n-th order function approximation function generation circuit can separately adjust the operating point within the low temperature domain and the operating point within the high temperature domain, not only is the temperature characteristic that approximates the fourth order or the fifth order approximation function provided, but also the temperature characteristic that approximates the n-th order function.

$$V_n = D_{n-1}(T-T2)^{n+1} + D_n(T-T2)^n \quad [\text{Ex. 3}]$$

In this expression (3), $V_n$ denotes a control signal output by the n-th order approximation function generation circuit, T denotes an ambient temperature, $D_n$ denotes an n-th order coefficient, T2 denotes a peak change point for a function $V_n$, and n denotes a real number, the absolute value of which is four or greater.

According to the arrangement of the second aspect of the invention, the n-th order approximation function generation circuit generates and outputs a control signal upon receiving an analog signal from the second analog signal generation circuit, which generates and outputs a predetermined analog signal that is affected by the ambient temperature and that differs from the first analog signal generation circuit that generates and outputs a predetermined analog signal that is not affected by the ambient temperature. Therefore, independently, the peak change points Ti of the third order approximation function generation circuit and the zero-th order function generation circuit can be adjusted by the first peak change point adjustment circuit, and the peak change point T2 for the n-th order approximation function generation circuit can be adjusted by the second peak change point adjustment circuit.

Furthermore, the n-th order approximation function generation circuit is connected to a PROM circuit 13, shown in FIG. 13, that will be described later, and can adjust a plurality of temperature compensation parameters $D_n$, Dn−1, . . . and D4 represented in expression (3).

Further, since the n-th order approximation function generation circuit does not affect a temperature domain other than the operating temperature domain of this circuit, voltage noise caused by a function generation circuit is the same as that when the n-th order approximation function generation circuit is not present.

According to a third aspect of the present invention, a function generation circuit, which performs temperature compensation for a quartz oscillation apparatus, comprises:

a first analog signal generation circuit, for generating and outputting a predetermined analog signal that is not affected by an ambient temperature;

a second analog signal generation circuit, for generating and outputting an analog signal that is affected by the ambient temperature and that is to approximate a first order function;

a third order approximation function generation circuit, for receiving analog signals from the first analog signal generation circuit and the second analog signal generation circuit, and for outputting a signal;

a first order function generation circuit, for receiving the analog signal from the second analog signal generation circuit and generating a first order function control signal that is affected by the ambient temperature;

a zero-th order function generation circuit, for receiving the analog signal generation circuit from the first analog signal generation circuit and generating a zero-th order function control signal that is not affected by the ambient temperature;

a first peak change point adjustment circuit, for receiving the analog signal from the second analog signal generation circuit, adjusting a temperature at a peak change point and outputting the result to the third order approximation function generation circuit and the first order function generation circuit;

a low temperature operating domain adjustment circuit, for receiving the analog signal from the second analog signal generation circuit and for adjusting an operating temperature domain for a low temperature domain control circuit that outputs a low temperature domain control signal corresponding to a low temperature domain;

a high temperature operating domain adjustment circuit, for adjusting an operating temperature domain for a high temperature domain control circuit that outputs a high temperature domain control signal corresponding to a high temperature domain;

an n-th order approximation function generation circuit, for receiving signals from the low temperature operating domain adjustment circuit, the high temperature operating domain adjustment circuit and the second analog signal generation circuit, and for generating and outputting s low temperature domain control signals (s is an integer of two or greater) and t high temperature domain control signals (t is an integer of two or greater), which correspond respectively to s contiguous temperature domains and t contiguous temperature domains that are obtained by dividing a low temperature range and a high temperature range available for the ambient temperature;

a second peak change point adjustment circuit, for receiving the analog signal from the second analog signal generation circuit, adjusting a peak change point and outputting a signal to the n-th order approximation function generation circuit; and an adder, for synthesizing the signals output by the third order approximation function generation circuit, the first order function generation circuit, the zero-th order function generation circuit and the n-th order approximation function generation circuit.

According to the arrangement of the third aspect of the invention, the signal output by the third order approximation function generation circuit has a temperature characteristic represented by expression (1), and the signal output by the n-th order approximation function generation circuit has a temperature characteristic represented by expression (3).

According to the arrangement of the third aspect of the invention, the n-th order approximation function generation circuit generates and outputs a control signal upon receiving an analog signal from the second analog signal generation circuit, which generates and outputs a predetermined analog signal, that is affected by the ambient temperature and that differs from the first analog signal generation circuit that generates and outputs a predetermined analog signal that is not affected by the ambient temperature. Therefore, independently, the peak change points Ti of the third order approximation function generation circuit and the zero-th order function generation circuit can be adjusted by the first peak change point adjustment circuit, and the peak change point T2 for the n-th order approximation function generation circuit can be adjusted by the second peak change point adjustment circuit.

Furthermore, the n-th order approximation function generation circuit is connected to a PROM circuit 13, shown in FIG. 13, that will be described later, and can adjust a plurality of temperature compensation parameters $D_n$, $D_{n-1}$, ... and $D4$ represented in expression (3).

According to the arrangement of the third aspect of the invention, the n-th order approximation function generation circuit generates control signals in consonance with the s contiguous temperature domains and the t contiguous temperature domains that are respectively obtained by dividing a low temperature range and a high temperature range available for the ambient temperature. Therefore, when the temperature range is divided into domains s and t, control signals that approximate the n-th order function can be generated.

Further, since the n-th order approximation function generation circuit does not affect a temperature domain, other than the operating temperature domain of this circuit, a voltage noise caused by a function generation circuit is the same as that when the n-th order approximation function generation circuit is not present.

According to the function generation circuit of this invention, an accurate TCXO can be provided for which the basic frequency fluctuation error, within a large temperature range, is only ±0.5 ppm.

DESCRIPTION OF THE PREFERRED EMBODIMENTS

A specific example function generation circuit according to the preferred embodiments of the present invention will now be described while referring to the accompanying drawings.

First Embodiment

Figure 1:
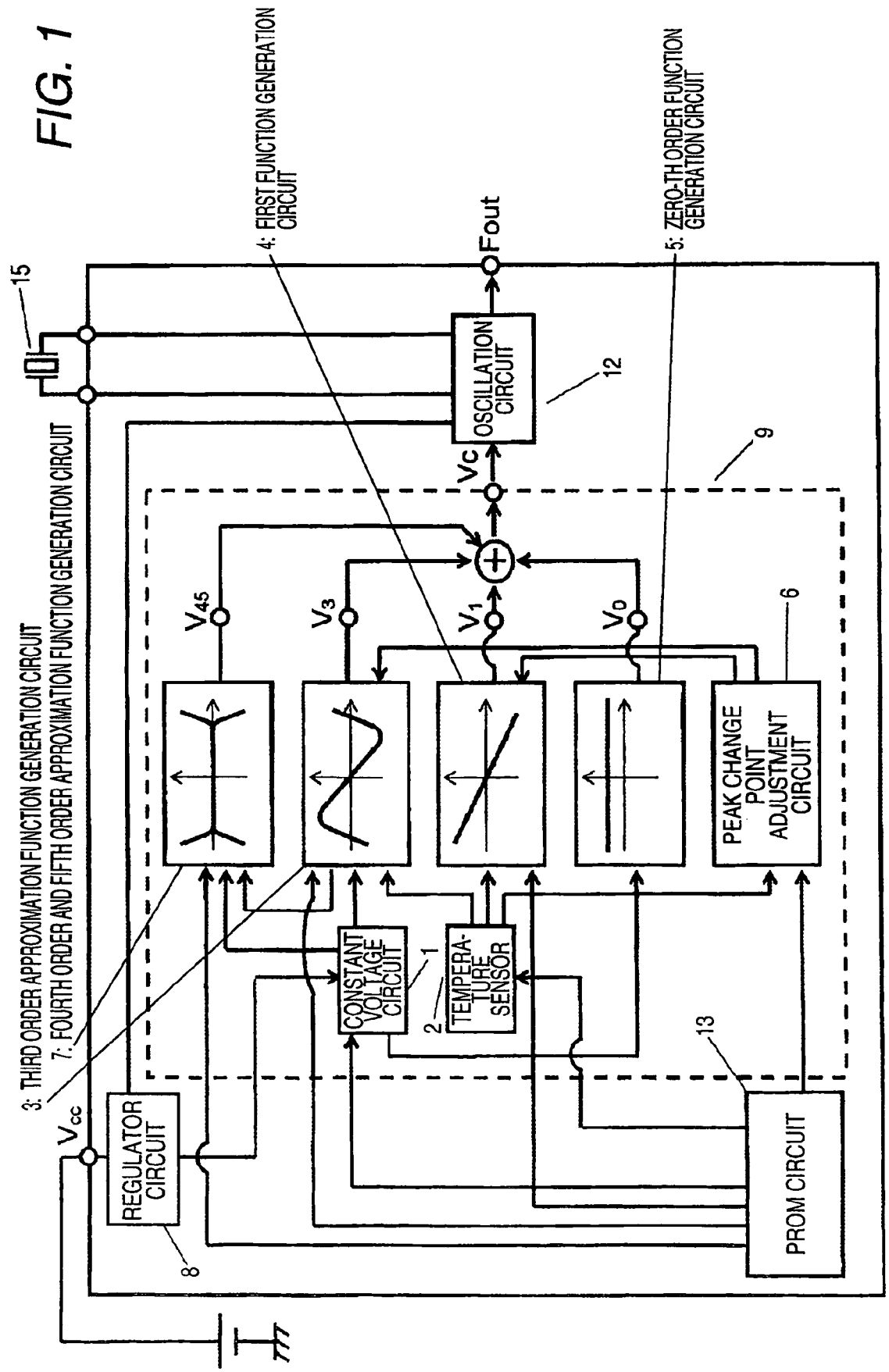
FIG. 1 is a diagram for explaining a function generation circuit according to a first embodiment of the present invention.

FIG. 1 is a diagram for explaining a function generation circuit according to a first embodiment of the present invention. In this embodiment, the function generation circuit, indicated by a broken line, serves as a temperature compensation circuit 9. While referring to FIG. 1, a constant voltage circuit 1 receives a control signal from a regulator circuit 8, and generates an analog signal that is not affected by an ambient temperature. While a temperature sensor circuit 2 outputs an analog signal that is affected by the ambient temperature.

A third order approximation function generation circuit 3 receives signals from the constant voltage circuit 1 and the temperature sensor circuit 2, and generates a third order approximation function control signal V3 that corresponds to a third order temperature characteristic parameter. A first order function generation circuit 4 receives a signal from the temperature sensor circuit 2, and generates a first order function control signal V1 that is affected by the ambient temperature.

A zero-th order function generation circuit 5 receives a signal from the constant voltage circuit 1, and generates a zero-th order control signal V0 that is not affected by the ambient temperature. A fourth order and fifth order approximation function generation circuit receives signals from the temperature sensor circuit 2 and the third order approximation function generation circuit 3, and generates a fourth order and fifth order function control signal V45 that is affected by the ambient temperature.

A peak change point adjustment circuit 6 outputs a signal to adjust the value of a peak change point temperature Ti for the third order approximation function generation circuit 3, the first order function generation circuit 4 and the fourth order and fifth order approximation function generation circuit 7, and outputs a signal. By adding the control signals V0, V1, V3 and V45, the temperature compensation circuit 9 outputs a control signal Vc.

A PROM circuit 13 stores temperature compensation parameters to compensate for the temperature characteristic of the control signal Vc, so that the temperature characteristic of an oscillation frequency, output by a voltage-controlled oscillation circuit 12 that includes a crystal unit 15, can be optimized relative to the control signal Vc, output by the temperature compensation circuit 9. To obtain the output frequency, the quartz unit 15 and the voltage control oscillation circuit 12 perform frequency conversion for the control signal Vc output by the temperature compensation circuit 9.

Figure 2:
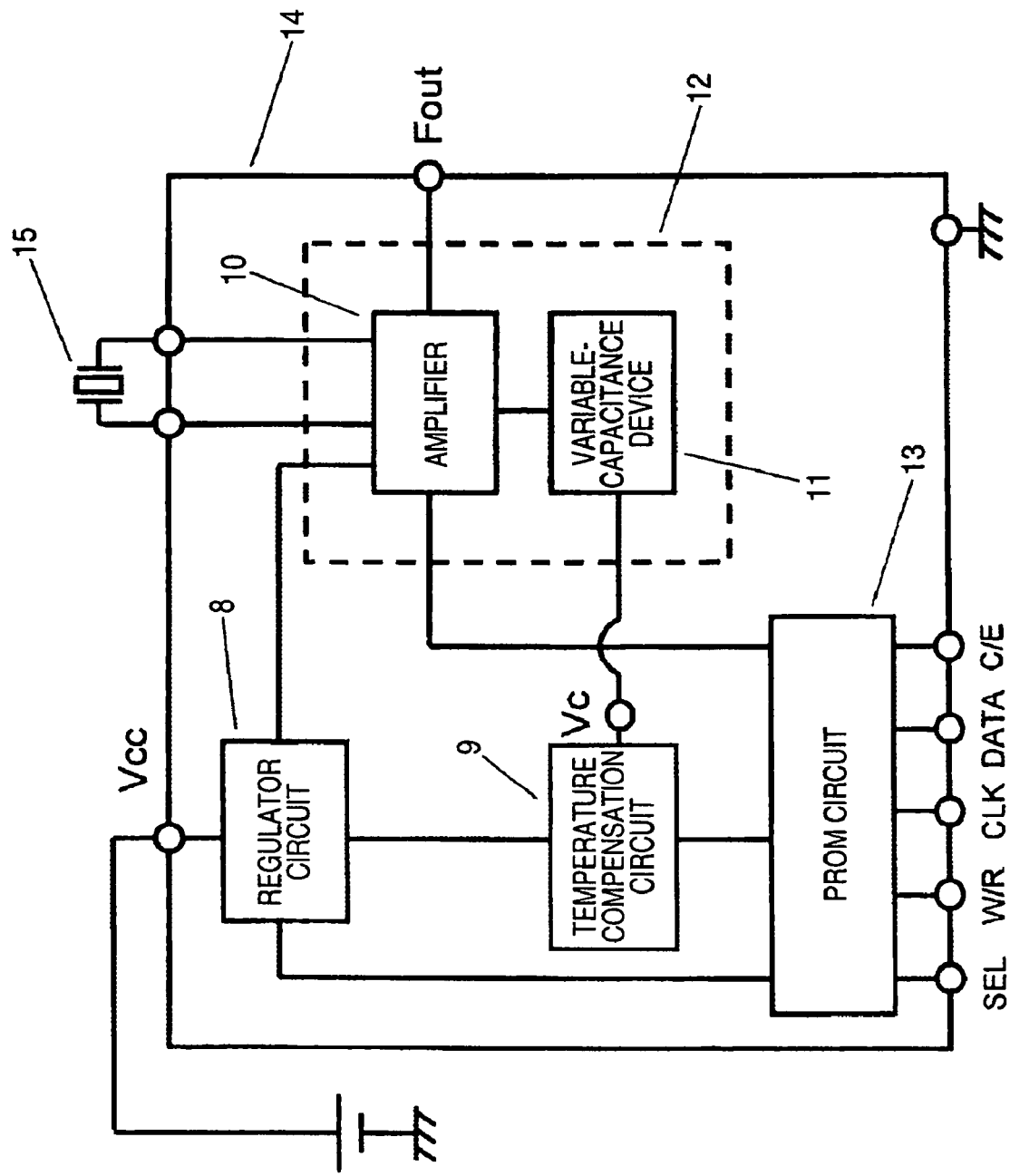
FIG. 2 is a block diagram showing an arrangement of a temperature-controlled quartz oscillator (TCXO) according to the first embodiment of the invention.

FIG. 2 is a schematic diagram showing the arrangement of a temperature-compensating quartz oscillator (hereinafter referred to as a TCXO) that incorporates the function generation circuit of this embodiment. The function generation circuit for this embodiment is applied for the temperature compensation circuit 9. As shown in FIG. 2, a TCXO 14 is a temperature-compensating quartz oscillator that oscillates a reference frequency used for an electronic apparatus, and that comprises: a voltage-controlled oscillation circuit 12, which includes a crystal unit 15 and a variable-capacitance device 11; a circuit 9, for performing temperature compensation for an oscillation frequency of a crystal; and a PROM circuit 13, which stores temperature compensation data for a crystal.

The voltage-controlled oscillation circuit 12 includes the variable-capacitance device 11 and an amplifier 10. A control signal Vc, output by the temperature compensation circuit 9, is transmitted to the variable-capacitance device 11. The variable-capacitance device 11 converts the received control signal Vc into the load capacitance for the amplifier 10, i.e., uses the control signal Vc to change the load capacitance of the amplifier 10, so that the output frequency of the voltage-controlled oscillation circuit is changed.

The crystal unit 15 has a temperature characteristic that approximates the following third order function.

$$Fc = a(T-T0)^3 + b(T-T0) + c \quad \text{[Ex. 4]}$$

In expression (4), Fc denotes the output frequency of a crystal unit, T denotes an ambient temperature, a denotes a third order coefficient, b denotes a first order coefficient, c denotes a zero-th order coefficient, and To denotes a peak change point for a function Fc.

Further, the voltage-controlled oscillation circuit, which includes the variable-capacitance device, has a temperature characteristic that approximates the following first order function.

$$Fo = d(T-T1) + e \quad \text{[Ex. 5]}$$

In expression (5), Fo denotes the output frequency of a voltage-controlled oscillation circuit that includes a crystal unit that does not have a temperature characteristic, T denotes an ambient temperature, d denotes a first order coefficient, e denotes a zero-th order coefficient, and T1 denotes a peak change point for a function Fo.

By referring to expressions (4) and (5), the entire temperature characteristic of the voltage-controlled oscillation circuit, which includes the crystal unit and the variable-capacitance device, has a temperature characteristic that approximates the third order function below.

$$F = \alpha(T-T0)^3 + \beta(T-T0) + \gamma \quad \text{[Ex. 6]}$$

In expression (6), F denotes the output frequency of a voltage-controlled oscillation circuit that includes a crystal unit, T denotes an ambient temperature, $\alpha$ denotes a third order coefficient, $\beta$ denotes a first order coefficient, $\gamma$ denotes a zero-th order coefficient, and $F = Fc + Fo$, $\alpha = a$, $\beta = b + d$ and $\gamma = c + d(T0 - T1) + e$.

According to the arrangement of this TCXO, since the temperature compensation circuit compensates for the temperature characteristic of the entire voltage-controlled oscillation circuit that includes the crystal unit and the variable-capacitance device, a predetermined oscillation frequency can be output in any kind of environment.

In order to detect the ambient temperature in the external environment, the temperature compensation circuit mainly includes a temperature sensor that employs a current proportional to band gap reference Vt, a temperature sensor that utilizes the temperature characteristic of a resistor, or a temperature sensor that utilizes the temperature characteristic of a diode.

A third order approximation function generation circuit is provided by using one of these temperature sensors, and a voltage-controlled oscillation circuit, which includes a crystal unit, is employed by the application of a control voltage to a varactor. With this arrangement, temperature compensation is performed for the temperature characteristic of the crystal unit.

A control signal generated by the temperature compensation circuit 9 is transmitted to the variable-capacitance device 11 of the voltage-controlled oscillation circuit 12 and is converted into a capacitance. This capacitance is converted into a frequency by the crystal unit 15 and the voltage-controlled oscillation circuit 12, and the frequency is output.

Since a relationship between the control signal, generated by the temperature compensation circuit 9, and the output frequency approximates a first order function having a proportionality constant K, a product of the control signal generated by the temperature compensation circuit 9 and the proportionality constant K is output as an output frequency.

Figure 3:
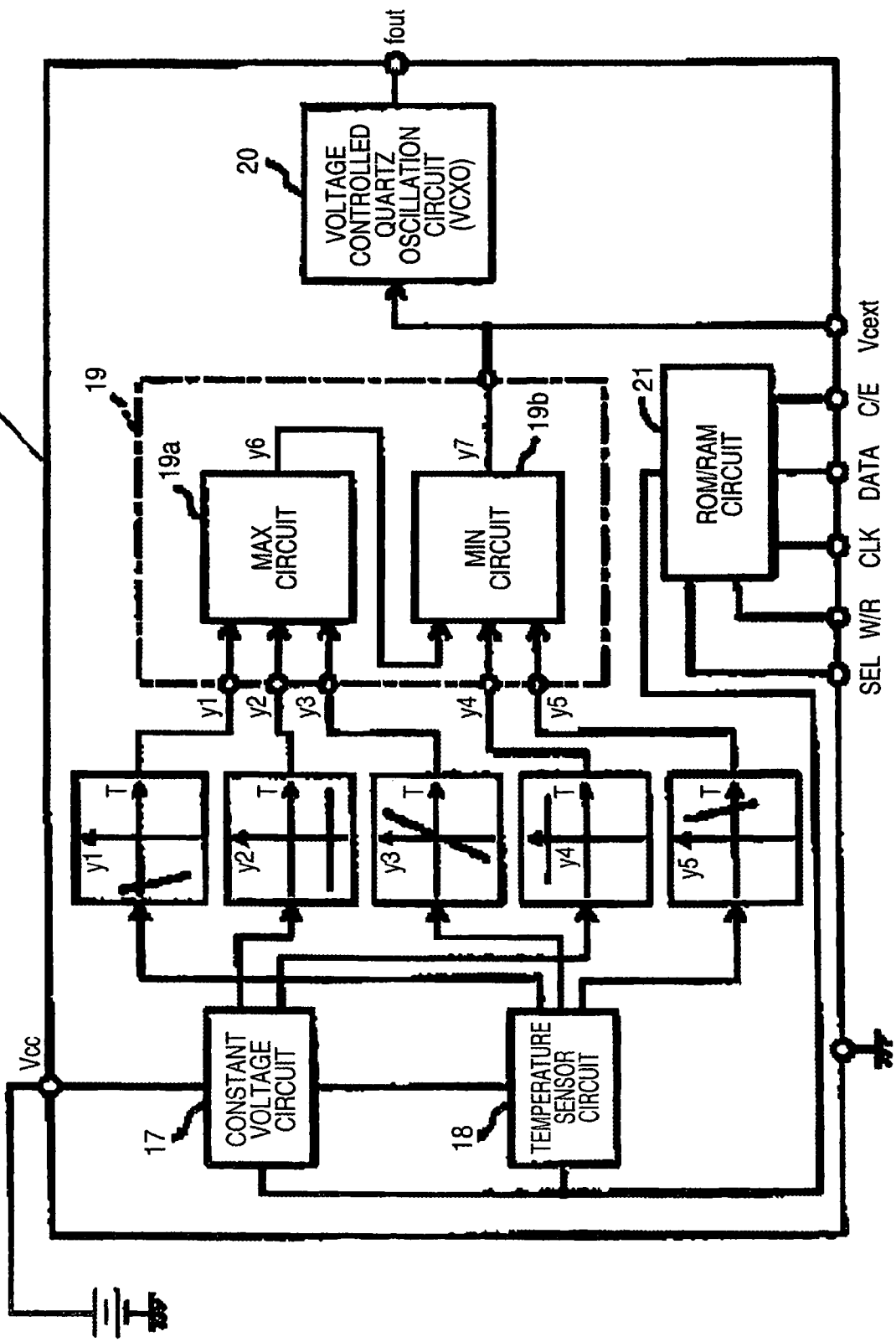
FIG. 3 is a block diagram showing a temperature compensation circuit A according to the previously submitted invention.

FIG. 3 is a schematic diagram showing the arrangement of a temperature compensation circuit A previously submitted by the present inventor (JP-A-11-508441). The function generation circuit of this embodiment is characterized in that fourth order or higher temperature characteristic parameters are included in a signal output by a temperature compensation circuit disclosed in the previous invention. First, the temperature compensation circuit disclosed in the previous invention will be described.

While referring to FIG. 3, a constant voltage circuit 17 and a temperature sensor circuit 18 generate control signals y1, y2, y3, y4 and y5 in consonance with five contiguous temperature domains from a low temperature side to a high temperature side, i.e., first, second, third, fourth and fifth temperature domains, that are obtained by dividing an available range for the ambient temperature. The control signals y1 to y5 are transmitted to a signal synthesis circuit 19 that includes a MAX circuit 19a and a MIN circuit 19b, and a control signal y7 is generated that is affected by the ambient temperature and approximates the third order function.

As described above, a quartz oscillation apparatus 16 equipped with a temperature compensation function comprises: the constant voltage circuit 17, which serves as a first analog signal generation circuit, for generating and outputting a predetermined voltage value that is not affected by the ambient temperature; the temperature sensor circuit 1, which serves as a second analog signal generation circuit, for generating and outputting a voltage value that is proportional to the ambient temperature; a control circuit 19, which receives a voltage, output by the constant voltage circuit 17, and a voltage, output by the temperature sensor circuit 18, that is proportional to the temperature and that generates a control voltage Vc, with which a crossover approximation is performed for a negative cubic curve, using a continuous line, in order to compensate for the temperature characteristic of the crystal unit throughout the entire temperature domain of the ambient temperature; a voltage-controlled quartz oscillation circuit (hereinafter abbreviated as a VCXO) 20, which receives the control voltage Vc from the control circuit 19, and for which the oscillation frequency is adjusted to a predetermined value based on the control voltage Vc; and a ROM/RAM circuit 21, which stores temperature compensation parameters used to compensate for the temperature characteristic of the control voltage Vc, so that the oscillation frequency output by the VCXO 20 can be optimized relative to the control voltage Vc output by the control circuit 19. In this case, the ambient temperature may either be the temperature in the VCXO 20 or the temperature in the quartz oscillation apparatus 16.

According to the circuit arrangement shown in FIG. 3, output voltages y1, y2, y3, y4 and y5 are generated that are proportional to the temperature, and the ROM/RAM circuit performs an adjustment for temperature compensation parameters. With this circuit arrangement, after the ROM/RAM circuit has performed the adjustment for temperature compensation parameters, output voltages y1, y2, y3, y4 and y5 are generated and are output via the MAX circuit and the MIN circuit. Therefore, because of the properties of the MAX circuit and the MIN circuit, the output of the temperature compensation circuit may not accurately reflect the temperature compensation parameters, depending on the proportionality factor in the temperature characteristics of the output voltages y1, y2, y3, y4 and y5.

Figure 4:
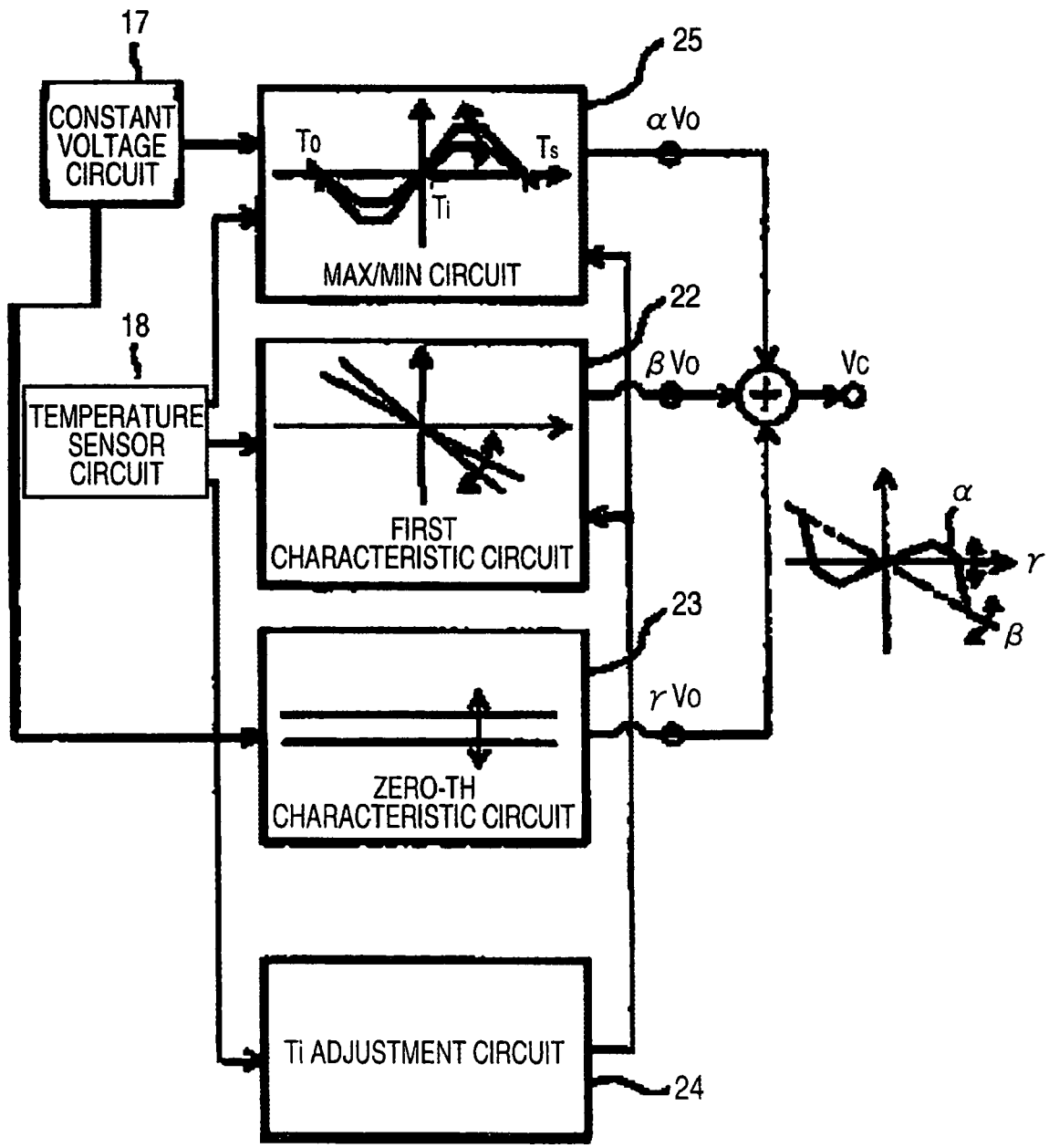
FIG. 4 is a block diagram showing a temperature compensation circuit B according to the previously submitted invention.

FIG. 4 is a schematic diagram showing the arrangement of a temperature compensation circuit B described in the previous invention (JP-A-11-508441). A temperature compensation circuit 40 shown in FIG. 4 has the same arrangement as the control circuit 19 in FIG. 3. That is, the temperature compensation circuit 40 includes: a MAX/MIN circuit 25, which receives the outputs of a constant voltage circuit 17 and a temperature sensor circuit 18, and which generates a third order control voltage αVc, consonant with a third temperature characteristic parameter α within a predetermined temperature range for a temperature compensation control voltage Vc; a first temperature characteristic generation circuit 22, which receives the output of the temperature sensor circuit 18, and which generates a first order control voltage βVc, consonant with a first order temperature characteristic parameter β within the predetermined temperature range for the temperature compensation control voltage Vc; a zero-th order temperature characteristic generation circuit 23, which receives the output of the constant voltage circuit 17, and which generates a zero-th order control voltage γVc, consonant with the zero-th order temperature characteristic parameter γ in the predetermined temperature range for the temperature compensation control voltage Vc, i.e., that is not affected by a temperature within the predetermined temperature range; and a Ti adjustment circuit 24, which receives the output of the temperature sensor circuit 18, and which adjusts the value of a peak change point temperature Ti and outputs the adjusted value to the MAX/MIN circuit 25 and the first order temperature characteristic circuit 22.

The temperature compensation circuit B in FIG. 4 is provided in order to remove a problem that has arisen in the temperature compensation circuit A in FIG. 3. According to the arrangement in FIG. 4, the MAX/MIN circuit 25 adjusts the third order temperature characteristic parameters and the peak change point parameters for the output voltages y1, y2, y3, y4 and y5, and generates the output voltage αVc.

Furthermore, the first order temperature characteristic generation circuit outputs the first order control voltage βVc obtained by adjusting the first order temperature characteristic parameter, and the zero-th order temperature characteristic circuit outputs the zero-th order control voltage γVc obtained by adjusting the zero-th order temperature characteristic parameter. When these outputs αVc, βVc and γVc are added together, the control signal Vc, which accurately reflects the temperature compensation parameters, can be output.

However, in this arrangement, since the control signal Vc, which accurately reflects the temperature compensation parameters, is still affected by the temperature characteristic of the voltage-controlled oscillation circuit, and the third order or higher temperature characteristic parameter is included in the temperature characteristic of the crystal unit, provision of the basic frequency fluctuation error within ±0.5 ppm is not yet possible.

Figure 5A:
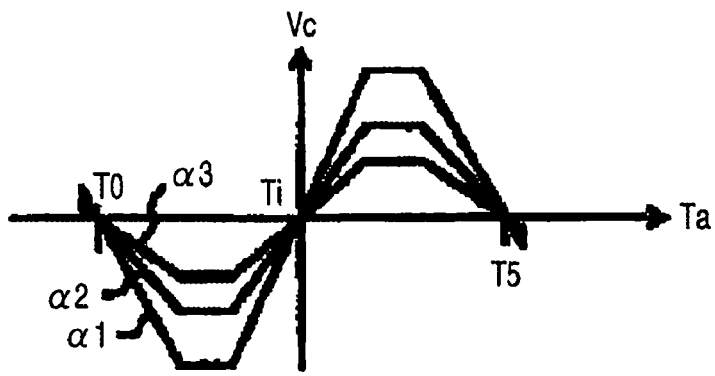
FIGS. 5A to 5D are characteristic graphs showing the changes in characteristics when the temperature compensation circuit B in the previous invention has adjusted the temperature compensation parameters.
Figure 5B:
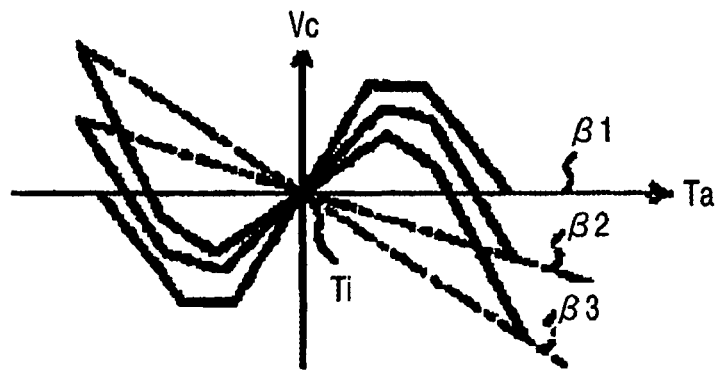

FIGS. 5A to 5B are diagrams showing a change in the characteristic of Vc relative to a change in the temperature compensation parameter for the temperature compensation circuit B of the previous invention (JP-A-11-5084441). The output Vc of the temperature compensation circuit has a temperature characteristic that approximates the following third order function.

$$Vc = \alpha_c(T-T_c)^3 + \beta_c(T-T_c) + \gamma_c \qquad [\text{Ex. 7}]$$

In expression (7), Vc denotes a signal output by the temperature compensation circuit, T denotes the ambient temperature, $\alpha c$ denotes a third order coefficient, $\beta c$ denotes a first order coefficient, $\gamma c$ denotes a zero-th order coefficient and Tc denotes a peak change point for a function Vc.

Figure 5C:
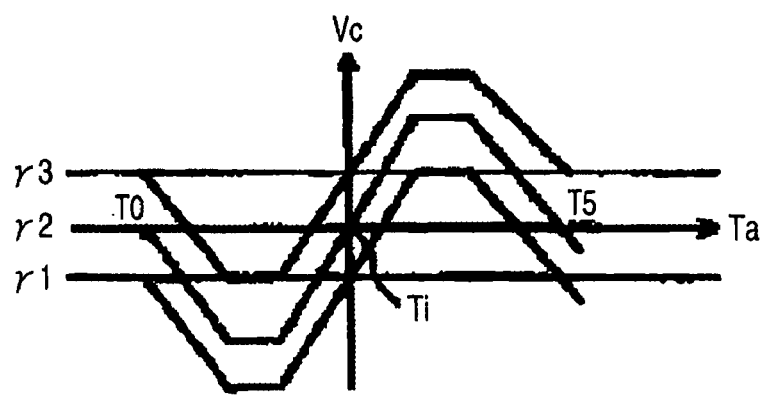
Figure 5D:
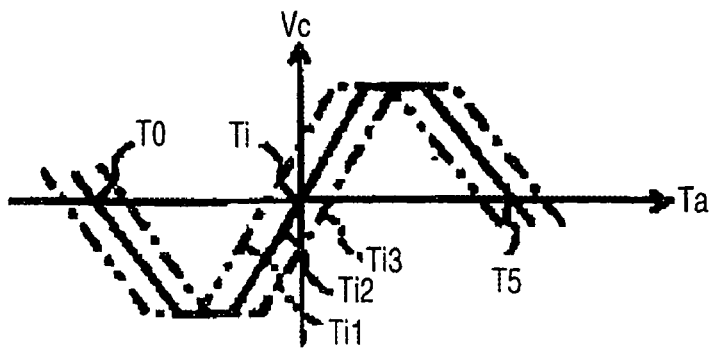

FIG. 5A is a graph showing a characteristic change for Vc relative to a change in the third order temperature compensation parameter $\alpha c$ in expression (7). FIG. 5B is a graph showing a characteristic change for Vc relative to a change in the first order temperature compensation parameter $\beta c$ in expression (7). FIG. 5C is a graph showing a characteristic change for Vc relative to a change in the zero-th order temperature compensation parameter $\gamma c$ in expression (7). FIG. 5D is a graph showing a characteristic change for Vc relative to a change in the temperature compensation parameter Tc for a peak change point in expression (7).

Figure 6A:
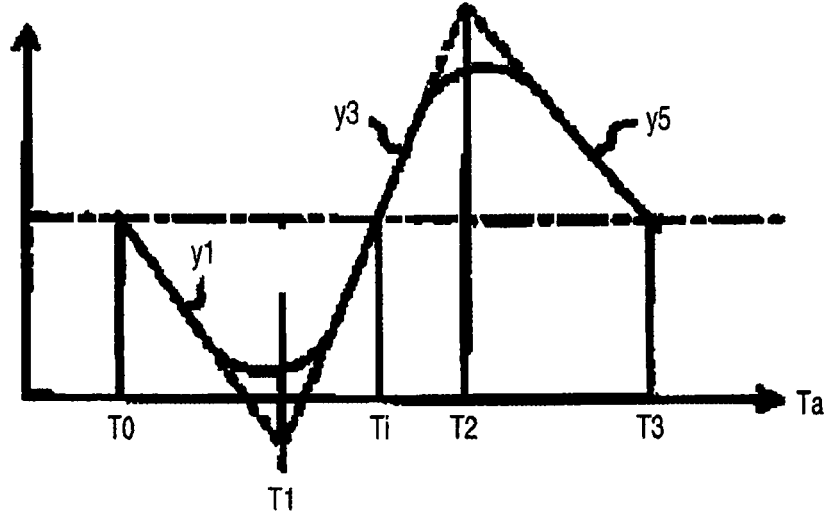
FIGS. 6A to 6C are characteristic graphs showing the characteristic of a signal Vc output by the temperature compensation circuit B in the previous invention, a voltage error between the output signal Vc and the ideal cubic curve, and the basic frequency fluctuation error for an output frequency.
Figure 6B:
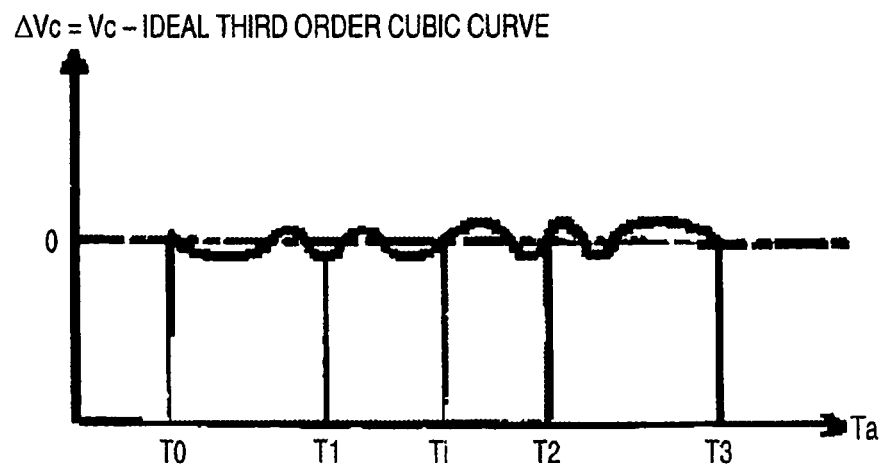
Figure 6C:
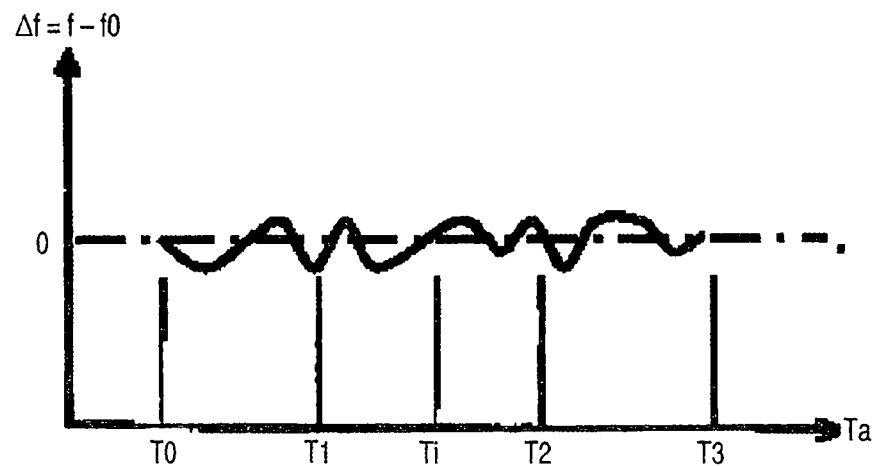

FIGS. 6A to 6C are graphs showing the characteristics of the temperature compensation circuit B for the previous invention in FIG. 4 (JP-A-11-508441). The graph in FIG. 6A shows the characteristic of Vc in FIG. 5, and the graph in FIG. 6B shows the characteristic of a difference ΔVc between Vc and the ideal cubic curve obtained by approximating Vc.

Vc is a signal output by the temperature compensation circuit for generating the third order approximation function; however, here, a small error occurs, compared with the ideal third order cubic curve. The factor causing this error can be a dispersion variation in a semiconductor IC manufacturing process, or the layout of an IC chip. The graph in FIG. 6C shows a frequency error Δf relative to an output frequency obtained through temperature compensation. Because of the error ΔVc for the control signal, an error relative to the ideal first order approximation for the voltage-controlled oscillation circuit, and an error relative to the ideal third order approximation for the crystal unit, the error Δf is about ±1 ppm.

As described above, the control signal Vc of the temperature compensation circuit 40 in FIG. 4 has the characteristic shown in FIG. 6A. The control signal Vc is approximated using the third order function, and an error obtained relative to the third order function is shown in FIG. 6B. Frequency conversion is performed for an error shown in FIG. 6B, and the obtained result is shown in FIG. 6C. According to the temperature compensation circuit in FIG. 4, the basic frequency fluctuation error that occurs as a result of temperature compensation is about ±1.0 ppm.

In concert with the development of information technologies, the uses to which electronic apparatuses have been put have become ever more diverse. Thus, the accuracy demanded for the TCXOs has grown as the employment of GPS has spread, and because of the precision that such employment entails, TCXOs are acceptable only when basic frequency fluctuation errors are limited to ±0.5 ppm.

Further, since a TCXO is installed in an electronic apparatus that includes a variety of other types of devices, noise generated by the TCXO could not only adversely affect the functioning of the other devices, but could produce deterioration of the characteristic of the electronic apparatus, either causing it to malfunction or to perform an erroneous operation.

As described above, according to the previous invention (JP-A-11-508441), since the voltage output by the temperature compensation circuit (FIGS. 3 and 4) approximates the third-order or lower function, when the temperature characteristic of the crystal unit used in the voltage-controlled oscillation circuit has been compensated for by the temperature compensation circuit, the output oscillation frequency has a basic frequency fluctuation error of about ±1.0 ppm.

The temperature characteristic of the crystal unit is generally approximate to the third order function represented in expression (4). In order to accurately approximate a function, a higher order must be taken into account. Furthermore, the temperature characteristic of the voltage-controlled oscillation circuit that includes the variable-capacitance device is also approximated using the first order function. However, since an accuracy error by the first order function can not be ignored, the approximation function must also be performed accurately. That is, the temperature compensation circuit should perform temperature compensation for the temperature characteristics, to include the temperature characteristic of the voltage-controlled oscillation circuit and the temperature characteristic of the crystal unit.

When the temperature characteristic of the crystal unit is approximated by using the third order or a lower function generation circuit, such as the previously described temperature compensation circuit, the accuracy requirement for the basic frequency fluctuation error of ±0.5 ppm can not be satisfied. Further, to also satisfy the accuracy requirement for the temperature characteristic of the voltage-controlled oscillation circuit, the error can not be ignored.

Therefore, instead of generating control voltages that approximate the third order or lower functions, the temperature compensation circuit must generate control voltages that approximate the fourth order function, the fifth order function and k-th order function elements, without causing the deterioration of other characteristics, such as the power current characteristic and the noise characteristic. In this case, k is a real number whose absolute value is one or greater.

Figure 7B:
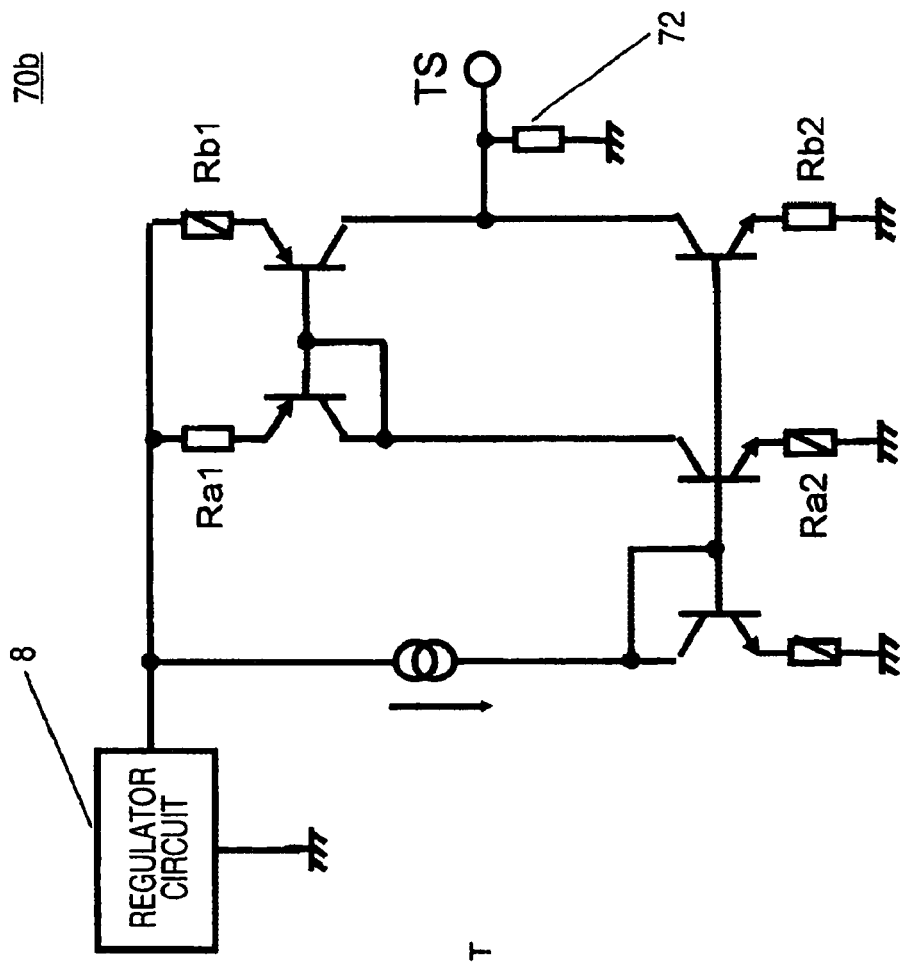
FIGS. 7A and 7B are circuit diagrams showing temperature sensor circuits for the function generation circuit of the first embodiment of the invention.
Figure 7A:
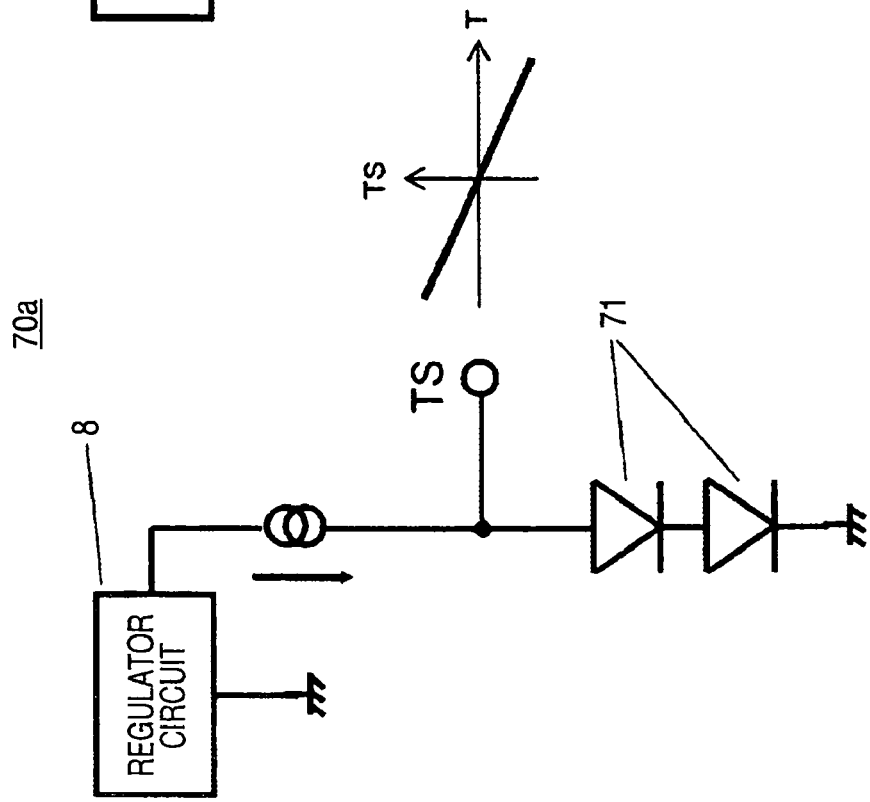

FIGS. 7A and 7B are diagrams showing example temperature sensor circuits employed for the function generation circuit according to the first embodiment of the invention. The circuit example in FIG. 7A is a temperature sensor that employs the temperature characteristic of a diode. Each diode has a first order temperature characteristic of about −4 mV/° C., and the output bias of the temperature sensor and the inclination of the first order temperature characteristic are changed in consonance with the number of diodes. The circuit example in FIG. 7B is a temperature sensor that employs the temperature characteristics of two types of resistors. The mirror ratio of a current mirror circuit is changed by using the temperature characteristics of the resistors.

Figure 8:
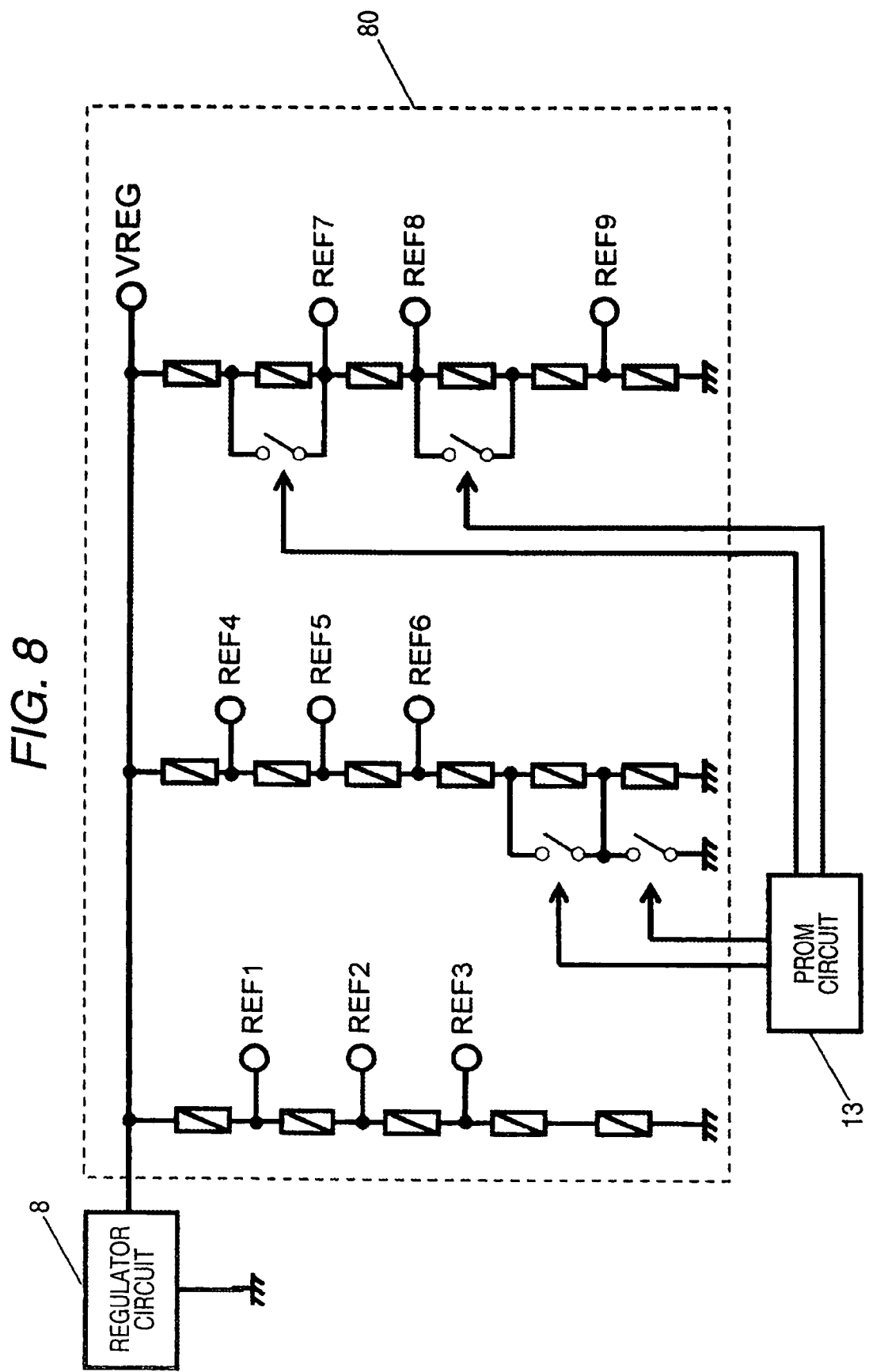
FIG. 8 is a circuit diagram showing the constant voltage circuit of the function generation circuit according to the first embodiment of the invention.

FIG. 8 is a diagram showing an example constant voltage circuit for the function generation circuit according to the first embodiment. This circuit 80 can employ a resistor to designate, as a desired constant voltage, a constant voltage VREG that is generated by a regulator circuit 8. Further, this circuit permits a PROM circuit 13 to perform an adjustment in order to obtain a desired constant voltage value.

Figure 9:
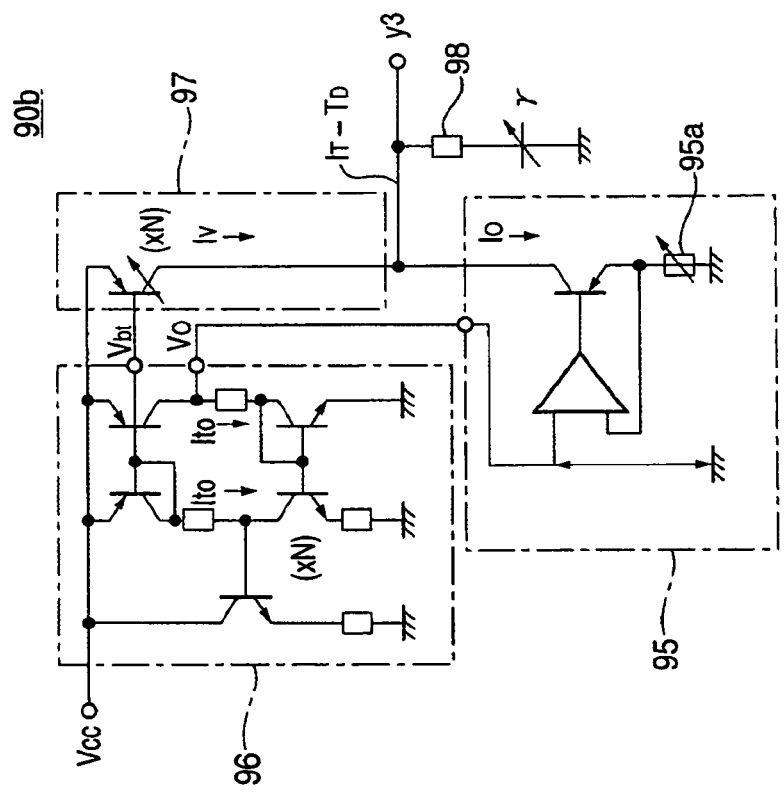
FIGS. 9A and 9B are circuit diagrams showing example third order approximation function generation circuits for the function generation circuit of the first embodiment.
FIGS. 9C and 9D are a circuit diagram and an characteristic diagram showing an example third order approximation function generation circuit for the function generation circuit of the first embodiment.
Figure 9:
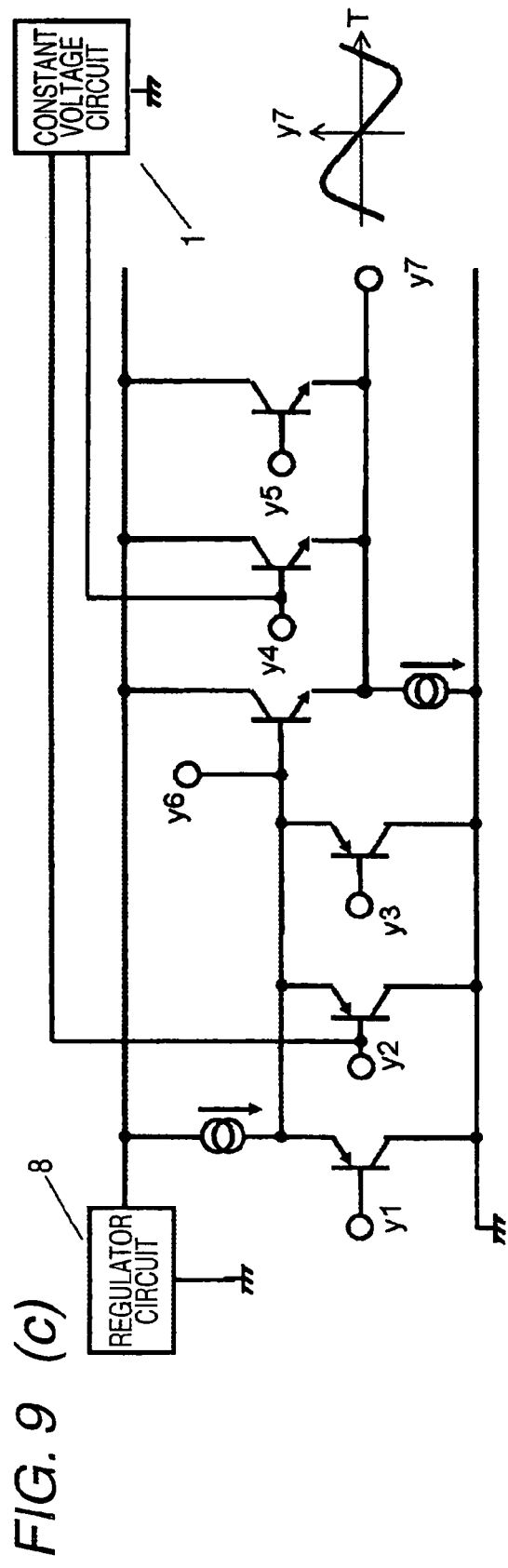
Figure 9:
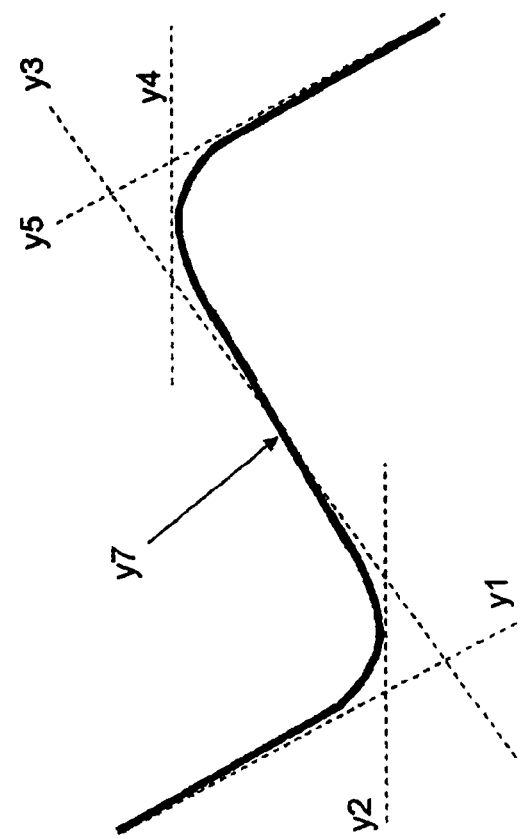

FIGS. 9A and 9B are diagrams showing example third order approximation function generation circuits for the function generation circuit according to the first embodiment of the invention. The circuit example in FIG. 9A is a monotone decreasing voltage generation circuit 90a, which includes the constant voltage circuit 17 and the temperature sensor circuit 18 shown in FIG. 4, and which generates and outputs the first control voltage y1 or the fifth control voltage y5, whose value is proportionately lowered in response to a rise in the ambient temperature Ta.

As shown in FIG. 9A, the monotone decreasing voltage generation circuit 90a includes: a constant voltage circuit 91, a band gap reference circuit 92 that serves a temperature sensor circuit, and a current mirror circuit 93. The band gap reference circuit 92 generates a reference voltage V0 of about 1.25 V that is not affected by the ambient temperature Ta, and the constant voltage circuit 91 generates a constant current I0 based on the reference voltage V0.

Further, the band gap reference circuit 92 generates a current IT0 that is affected by the ambient temperature Ta, while the current mirror circuit 93 generates a current IT, which is proportional to the ambient temperature Ta, and a differential current I0-IT, which is a difference between a constant current I0 and a current It that is proportional to the ambient temperature Ta, that is extracted at the juncture of the constant voltage circuit 91 and the current mirror circuit 93. Then, current-voltage conversion is performed using a resistor 94 to generate the first control voltage y1 or the fifth control voltage y5, which is a voltage that is monotone decreased in consonance with a rise in the ambient temperature Ta.

At this time, the absolute value of the first control voltage y1 or the fifth control value y5 is designated by adjusting the absolute value of a resistor 91a, in the constant voltage circuit 91, to which the power voltage Vcc is applied.

The circuit example in FIG. 9B is a monotone increasing voltage generation circuit 91b that includes the constant voltage circuit 17 and the temperature sensor circuit 18 in FIG. 4, and that generates and outputs the third control voltage y3, whose value is monotone increasing, in proportion to a rise in the ambient temperature Ta.

As shown in FIG. 9B, the monotone increasing voltage generation circuit 91b includes: a constant voltage circuit 95, a band gap reference circuit that serves as a temperature sensor circuit, and a current mirror circuit 87. The band gap reference circuit 96 generates a reference voltage V0, of about 1.25 V, that is not affected by the ambient temperature Ta, and the constant voltage circuit 95 generates a constant current I0 based on the reference voltage V0.

Further, the band gap reference circuit 96 generates a current IT0 that is affected by the ambient temperature Ta, while the current mirror circuit 97 generates a current IT, which is proportional to the ambient temperature Ta, and a differential current IT-I0, which is a difference between the constant current I0 and the current IT that is proportional to the ambient temperature Ta, that is extracted from the juncture of the constant voltage circuit 95 and the current mirror circuit 97. Then, current-voltage conversion is performed using a resistor 98 to generate the third control voltage y3, which is proportional to the ambient temperature Ta.

At this time, a voltage difference at the normal temperature between the third control voltage y3 and a voltage for providing the basic frequency for a displacement point temperature is designated by adjusting the resistance of a resistor 95a in the constant voltage circuit 95.

FIG. 9C is a circuit diagram showing an example signal synthesis circuit (MIN/MAX circuit) for synthesizing the voltages y1, y2, y3, y4 and y5 and outputting the result. First, from among the input voltages y1, y2 and y3, the maximum voltage (MAX value) is selected and is output as a voltage y6. Then, from among the voltages y6, y4 and y5, the minimum voltage (MIN value) is selected and is output as a voltage y7, as shown in FIG. 9D.

Figure 10:
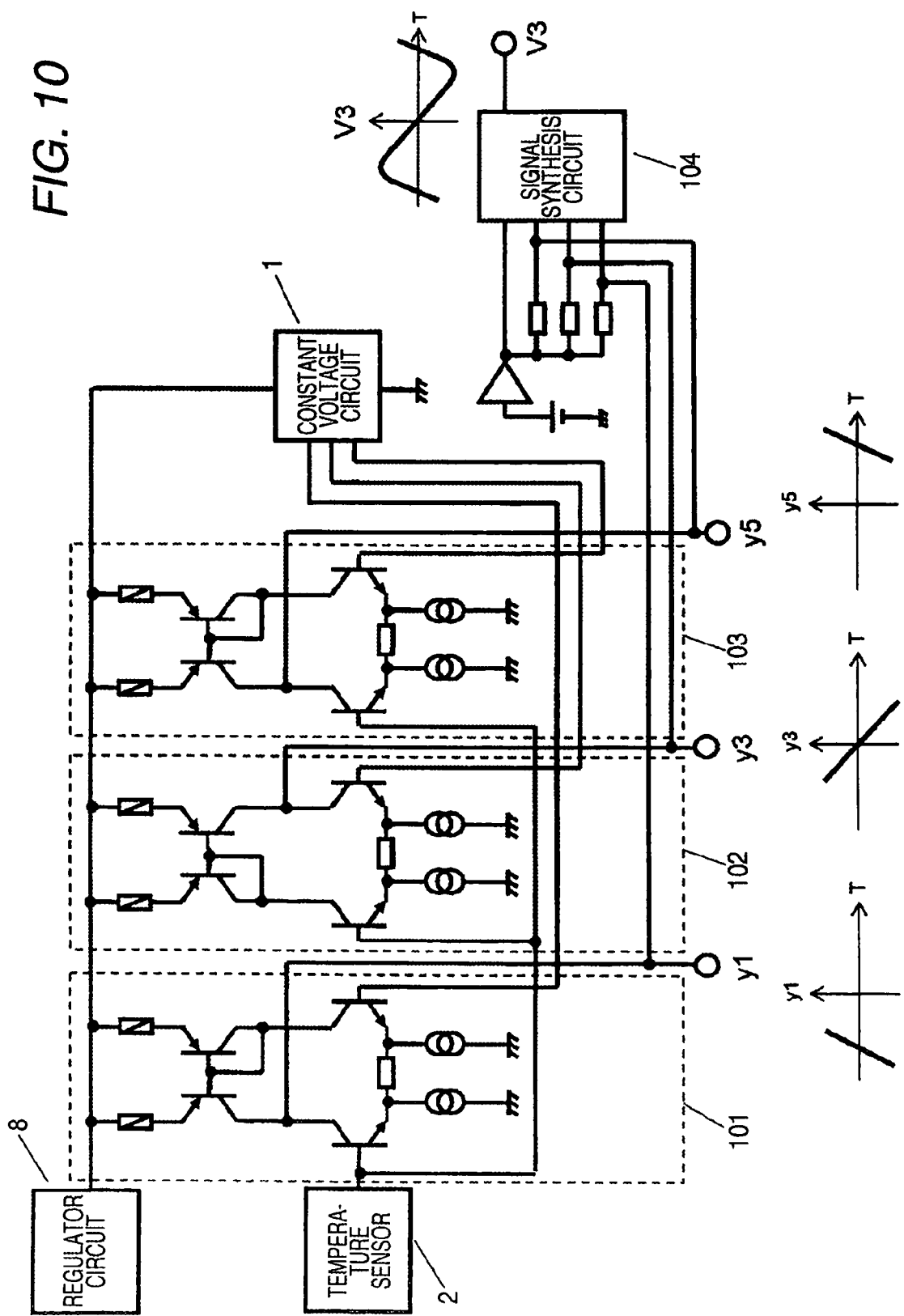
FIG. 10 is a circuit diagram showing an example third order approximation function generation circuit for the function generation circuit of the first embodiment.

FIG. 10 is a diagram showing an example third order approximation function generation circuit for the function generation circuit according to the first embodiment. In the third order approximation function generation circuit in FIG. 10, a constant voltage circuit 1 outputs first, third and fourth analog signals that are not affected by the ambient temperature, and a temperature sensor circuit 8 outputs a second analog signal that is affected by the ambient temperature and approximates the first function. An amplification circuit 101 receives the first analog signal and the second analog signal, and outputs an analog signal y1. An amplification circuit 102 receives the third analog signal and the second analog signal, and outputs an analog signal y3. An amplification circuit 103 receives the fourth analog signal and the second analog signal, and outputs an analog signal y5. A signal synthesis circuit 104 receives and synthesizes the analog signals y1, y3 and y5, and generates an output voltage V3 that approximates the third order temperature characteristic.

Figure 11:
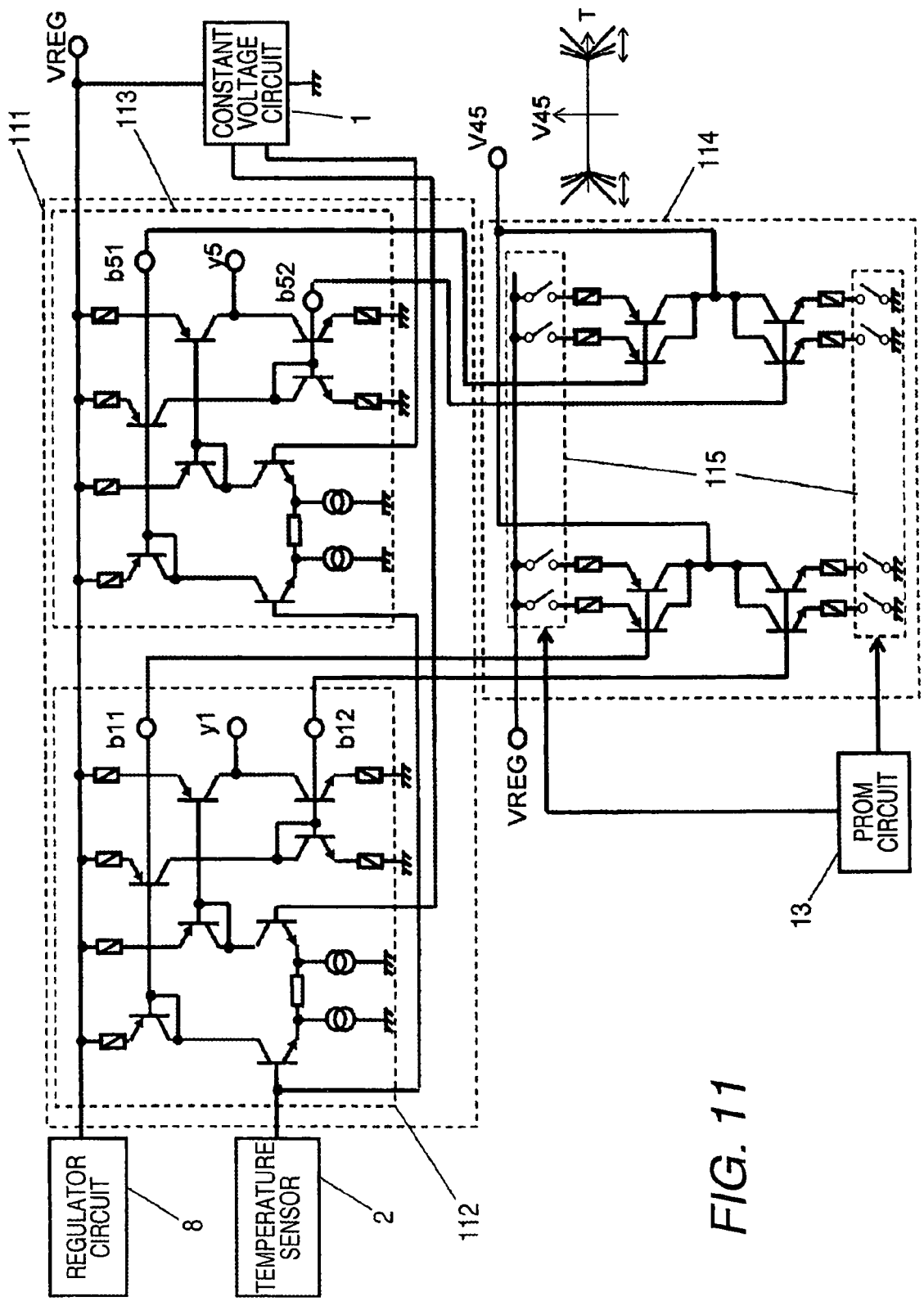
FIG. 11 is a circuit diagram showing an example fourth order and fifth order approximation function generation circuit for the function generation circuit of the first embodiment.

FIG. 11 is a diagram showing an example fourth order and fifth order approximation function generation circuit for the function generation circuit according to the embodiment. In FIG. 11, a constant voltage circuit 1 outputs a first analog signal and a third analog signal that are not affected by the ambient temperature, and a temperature sensor circuit 8 outputs a second analog signal that is affected by the ambient temperature and approximates the first function. In a third order approximation function generation circuit 111, an amplification circuit 112 receives the first analog signal and the second analog signal and outputs analog signals b11 and b12, and an amplification circuit 113 receives the third analog signal and the second analog signal and outputs analog signals b51 and b52.

A fourth order and fifth order approximation function generation circuit 114 is provided by receiving the signals b11, b12, b21 and b22 from the third order approximation function generation circuit 111. Further, when switches are controlled by a PROM circuit 13, a temperature compensation parameter can be adjusted for a control signal V45 output by the fourth order and fifth order approximation function generation circuit 114.

As described above, according to the function generation circuit of the first embodiment, a TCXO that performs accurate temperature compensation can be provided, without degrading the noise condition near the normal temperature, and an increase in the size of a circuit can be avoided.

Figure 12A:
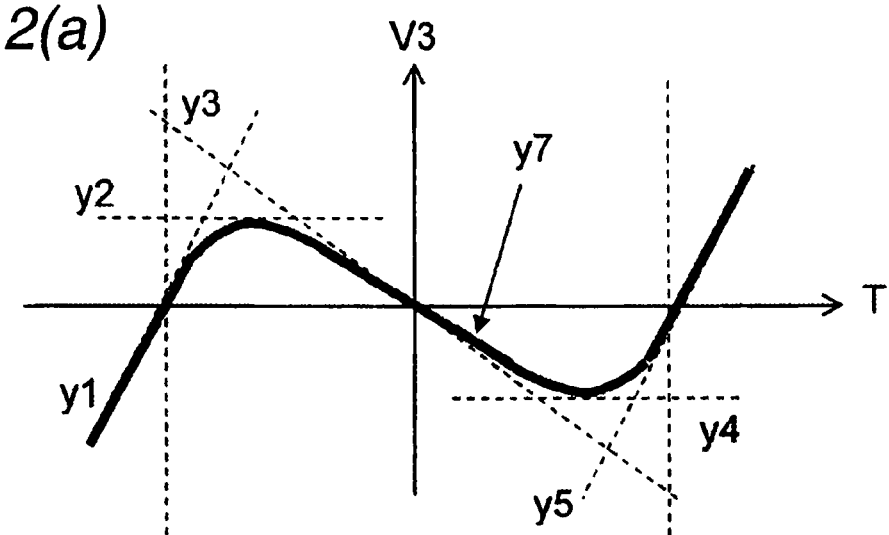
FIGS. 12A to 12C are graphs showing the characteristic for a temperature compensation circuit obtained in a case wherein the third order approximation function generation circuit and the fourth order and fifth order approximation function generation circuit for the function generation circuit of the first embodiment are employed.
Figure 12B:
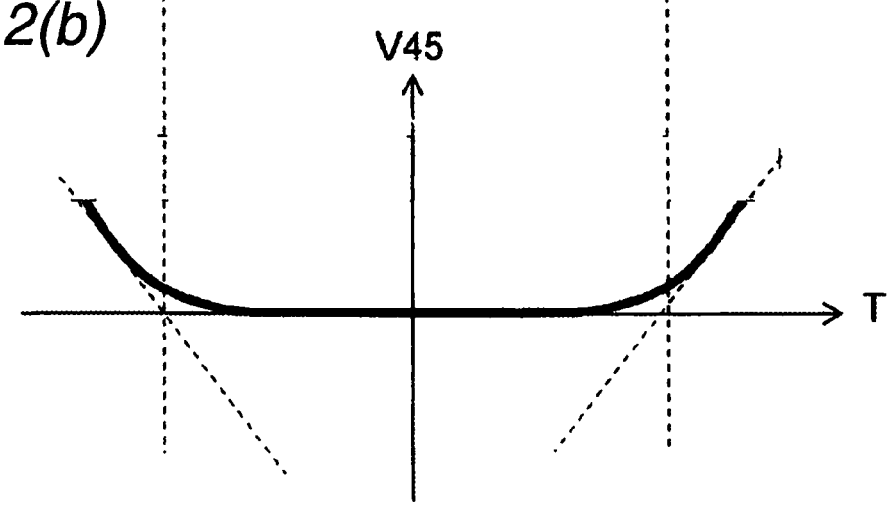
Figure 12C:
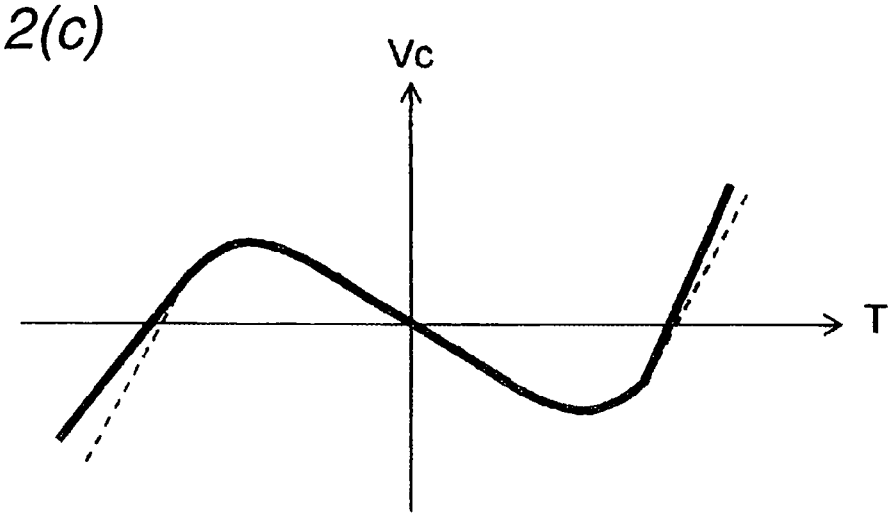

FIGS. 12A to 12C are graphs showing example characteristics of the function generation circuit according to the first embodiment. The graph in FIG. 12A shows the characteristic of a signal V3 output by the third order approximation function generation circuit. The graph in FIG. 12B shows the characteristic of a signal V45 output by the fourth order and fifth order approximation function generation circuit. As shown in FIG. 1, a signal Vc output by the temperature compensation circuit in FIG. 12C is obtained by adding the signal V3 to the signal V45.

Second Embodiment

Figure 13A:
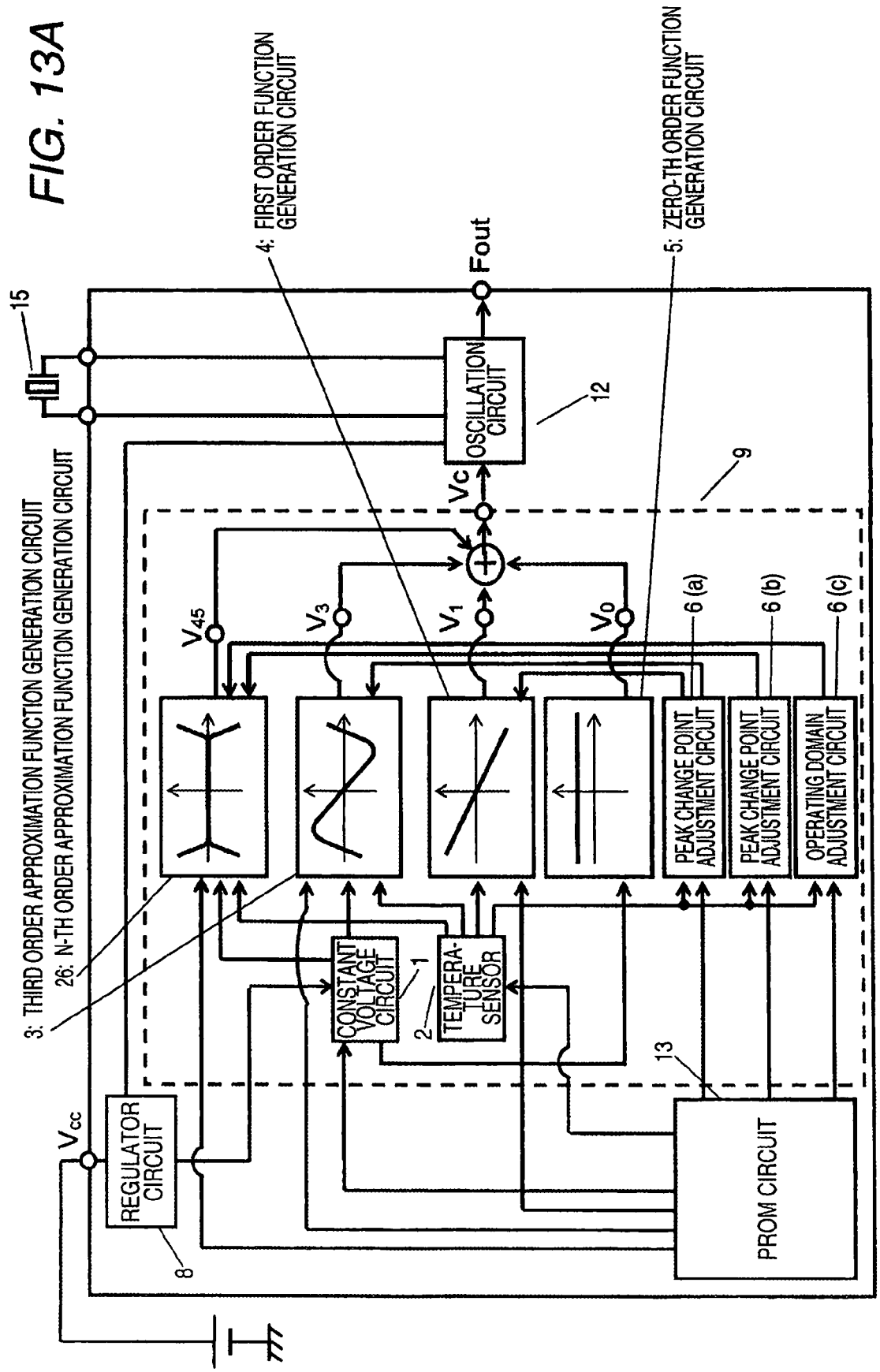
FIG. 13A is a diagram for explaining a function generation circuit according to a second embodiment of the present invention.

FIG. 13A is a diagram for explaining a function generation circuit according to a second embodiment of the present invention. In FIG. 13A, a constant voltage circuit 1 receives a control signal from a regulator circuit 8 and generates an analog signal that is not affected by the ambient temperature. A temperature sensor circuit 2 outputs an analog signal that is affected by the ambient temperature.

A third order approximation function generation circuit 3 receives signals from the constant voltage circuit 1 and the temperature sensor circuit 2 and generates a third order approximation function control signal V3 that is consonant with a third order temperature characteristic parameter. And a first order function generation circuit 4 receives a signal from the temperature sensor circuit 2 and generates a first order function control signal V1 that is affected by the ambient temperature.

A zero-th order function generation circuit 5 receives a signal from the constant voltage circuit 1 and generates a zero-th order control signal V0 that is not affected by the ambient temperature. And an n-th order approximation function generation circuit 26 receives signals from the constant voltage circuit 1 and the temperature sensor circuit 2 and generates a control signal V45 consonant with a low temperature domain and a control signal consonant with a high temperature domain.

Peak change point adjustment circuits 6a and 6b output signals to adjust the value of a peak change point temperature Ti, for the third order approximation function generation circuit 3 and the first order function generation circuit 4, and the value of a peak change point temperature T2, for the n-th order approximation function generation circuit 26. A temperature compensation circuit 9 adds the control signals V0, V1, V3 and V45, and outputs a control signal Vc.

An operating temperature domain adjustment circuit 6c adjusts the operating temperature domain of a high temperature domain control circuit, which is provided in the n-th order approximation function generation circuit 26 and which outputs a high temperature domain control signal in consonance with a high temperature area, and the operating temperature domain of a low temperature domain control circuit, which is provided in the n-th order approximation function generation circuit 26 and which outputs a low temperature domain control signal in consonance with a low temperature area.

A PROM circuit 13 stores a temperature compensation parameter to compensate for the temperature characteristic of a control signal Vc, so that the oscillation frequency output by a voltage-controlled oscillation circuit 12 can be optimized relative to the control signal Vc output by the temperature compensation circuit 9. The output frequency is obtained when a crystal unit 15 and the voltage-controlled oscillation circuit 12 perform a frequency conversion for the control signal Vc output by the temperature compensation circuit 9.

Figure 13B:
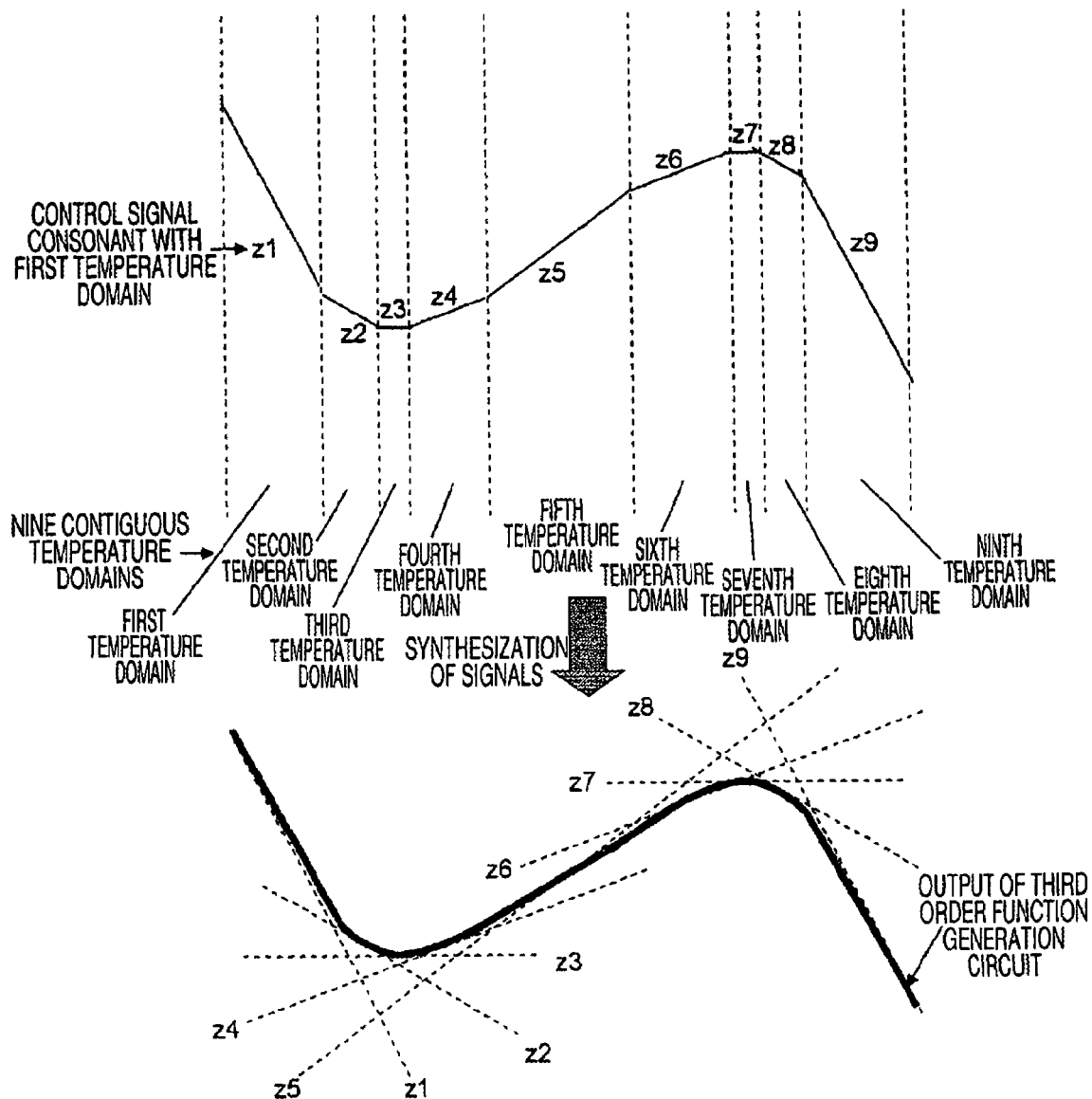
FIG. 13B is a diagram for explaining the characteristic of the function generation circuit in FIG. 13A (case wherein m=9).

FIG. 13B is a diagram for explaining the characteristic (case wherein m=9) of the third order function generation circuit in FIG. 13A. The third order function generation circuit 3 receives signals from the first analog signal generation circuit (constant voltage circuit 1) and from the second analog signal generation circuit (temperature sensor 2). Then, by using the outputs of the constant voltage circuit 1 and the temperature sensor 2, the characteristic for the third order function generation circuit shown in FIG. 13B is generated. Further, signal synthesis is performed by the signal synthesis circuit and the result is output.

Figure 14:
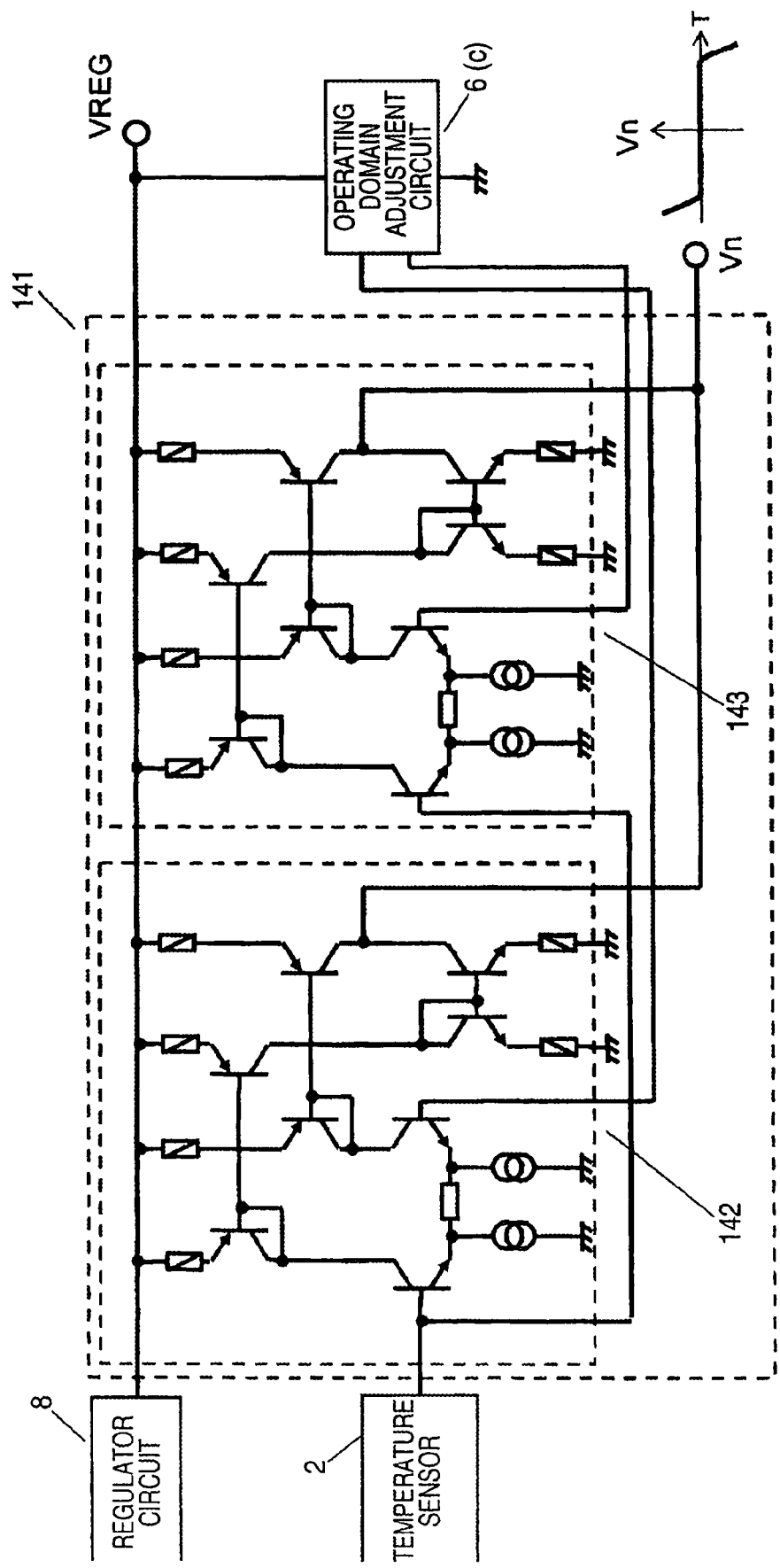
FIG. 14 is a circuit diagram showing an n-th order approximation function generation circuit for the function generation circuit according to the second embodiment.

FIG. 14 is a diagram showing an example n-th order approximation function generation circuit for the function generation circuit according to the second embodiment. In FIG. 14, a constant voltage circuit 1 outputs a first analog signal and a third analog signal that are not affected by the ambient temperature, and a temperature sensor circuit 8 outputs a second analog signal that is affected by the ambient temperature and approximates the first function. An amplification circuit 142 receives the first analog signal and the second analog signal, and generates a first function control signal that is consonant with the first temperature characteristic parameter in a low temperature domain. An amplification circuit 143 receives the third analog signal and the second analog signal, and generates the first function control signal that is consonant with the first temperature characteristic parameter in a high temperature domain. By adding the control signals output by the amplification circuits 142 and 143, a control signal $V_n$ is obtained that approximates the n-th order approximation function.

Figure 15:
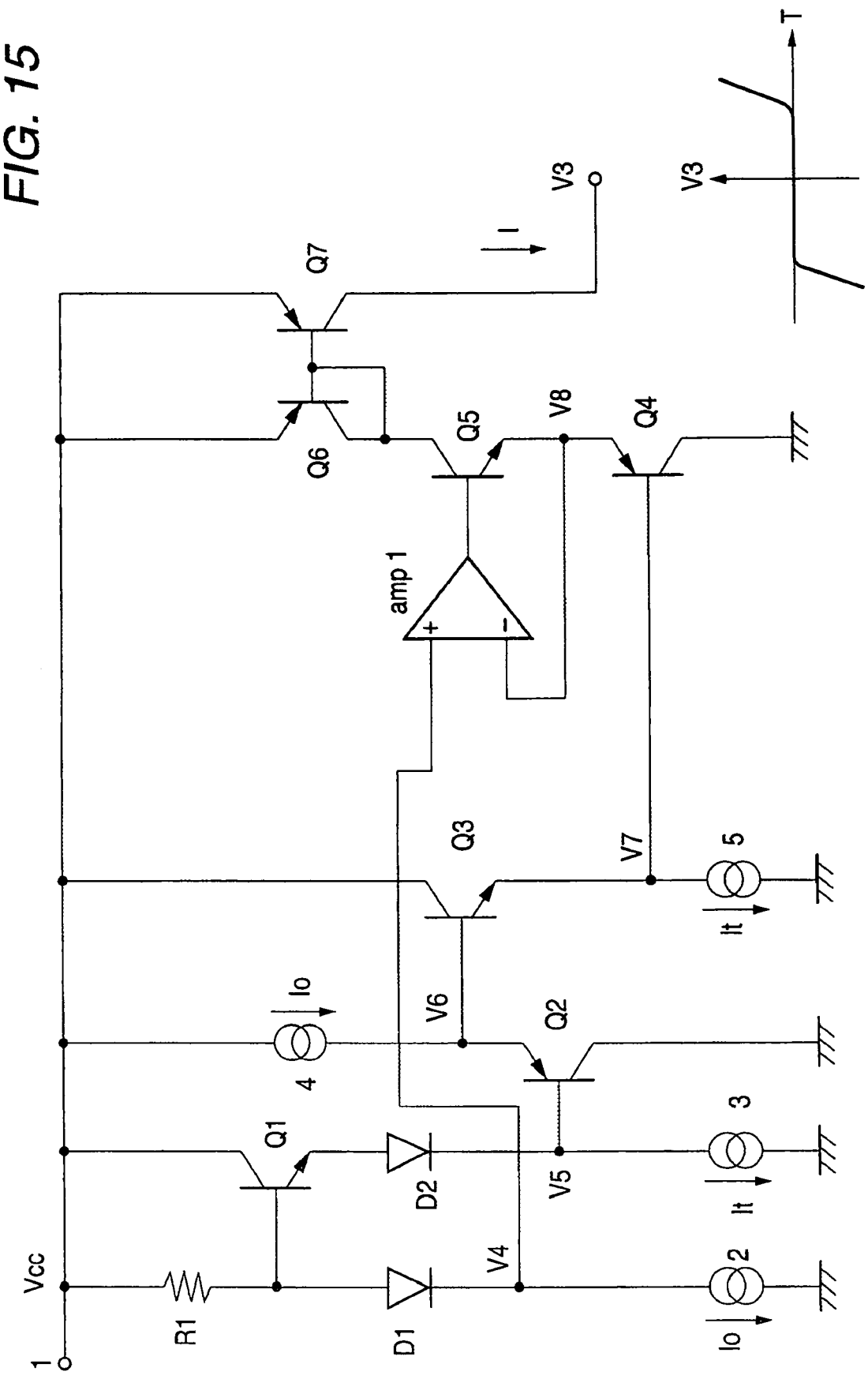
FIG. 15 is a circuit diagram showing a third order approximation function generation circuit for the function generation circuit according to the second embodiment.

FIG. 15 is a diagram showing an example third order approximation function generation circuit, described in the invention (JP-A-10-362689) previously submitted by the present inventor and used as the function generation circuit according to the second embodiment. As described above, according to the function generation circuit of this invention, a TCXO that performs accurate temperature compensation can be provided, without degrading the noise condition near the normal temperature.

Third Embodiment

Figure 16:
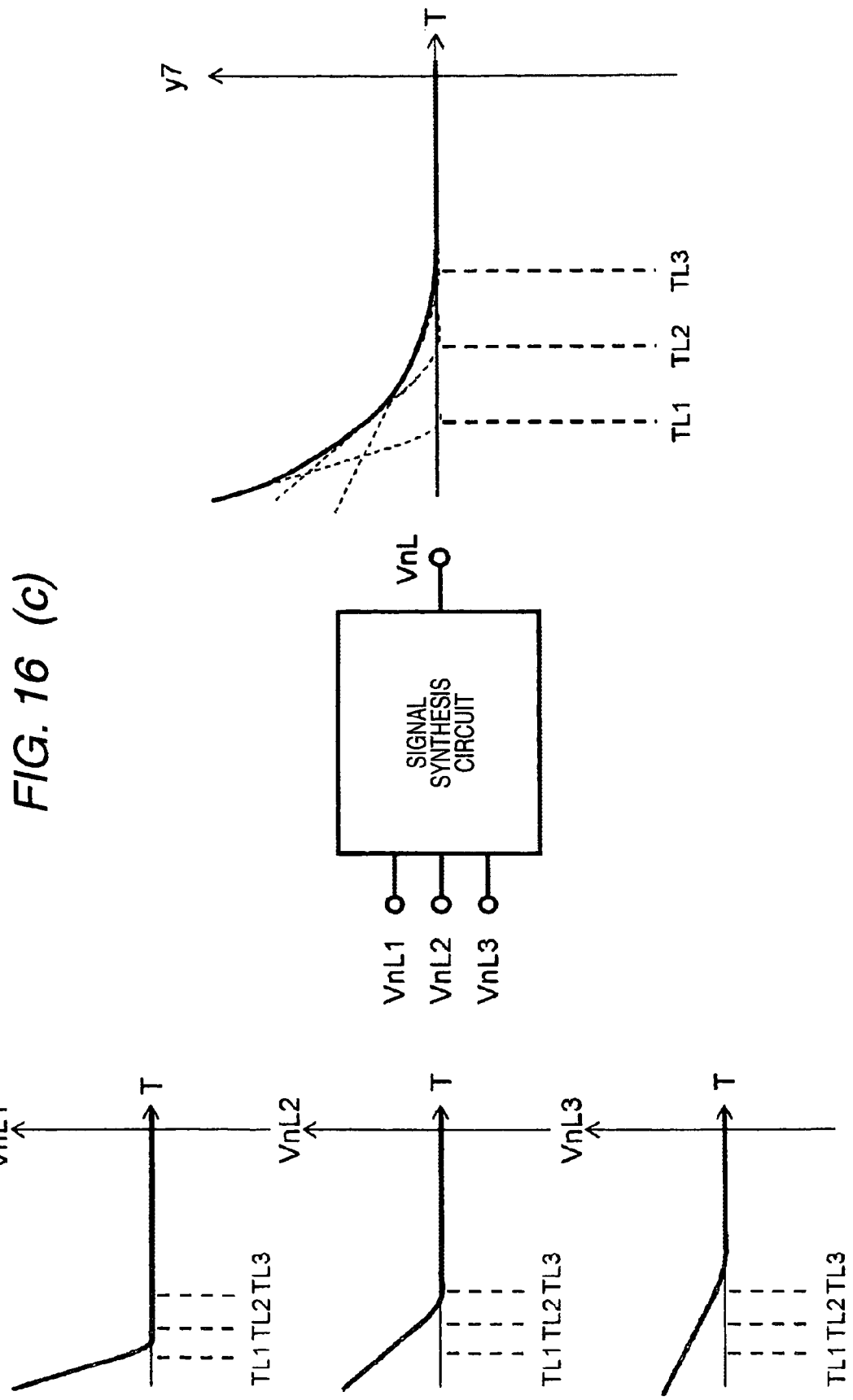
FIGS. 16A and 16B are a circuit diagram and graphs showing an n-th order approximation function generation circuit for the function generation circuit according to a third embodiment of the present invention.
FIG. 16C is a diagram showing the n-th order approximation function generation circuit of the function generation circuit according to the third embodiment.
Figure 17C:
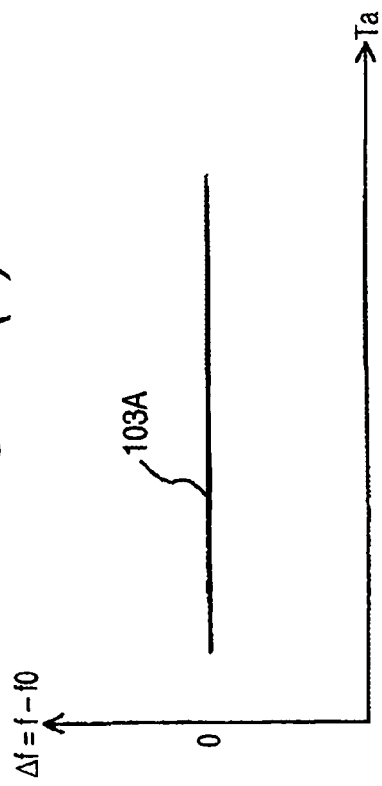
FIGS. 17A to 17C are graphs showing the temperature characteristic for the oscillation frequency of a quartz oscillator.
Figure 17A:
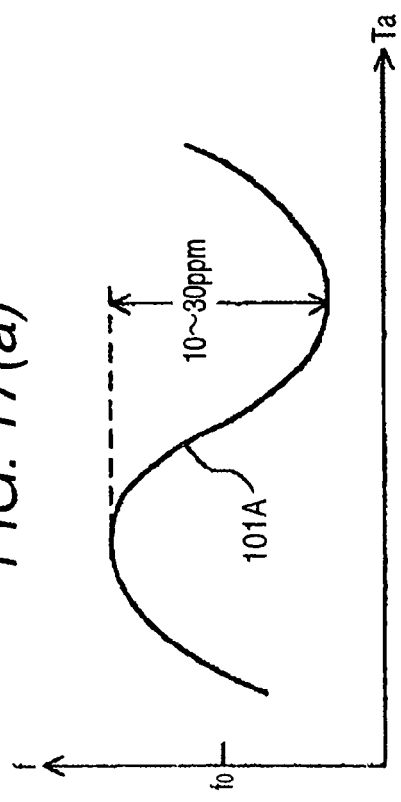
Figure 17B:
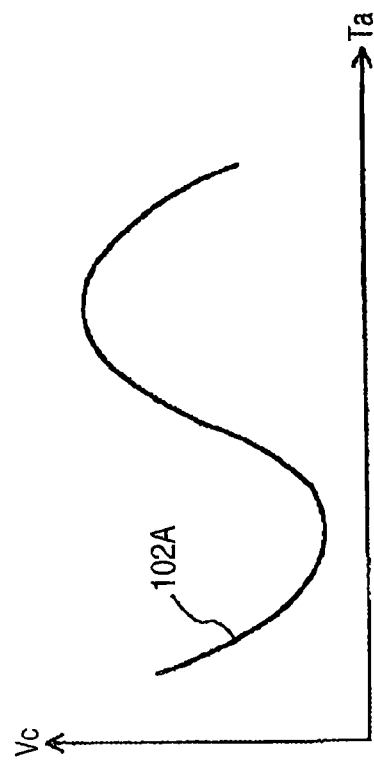
Figure 18:
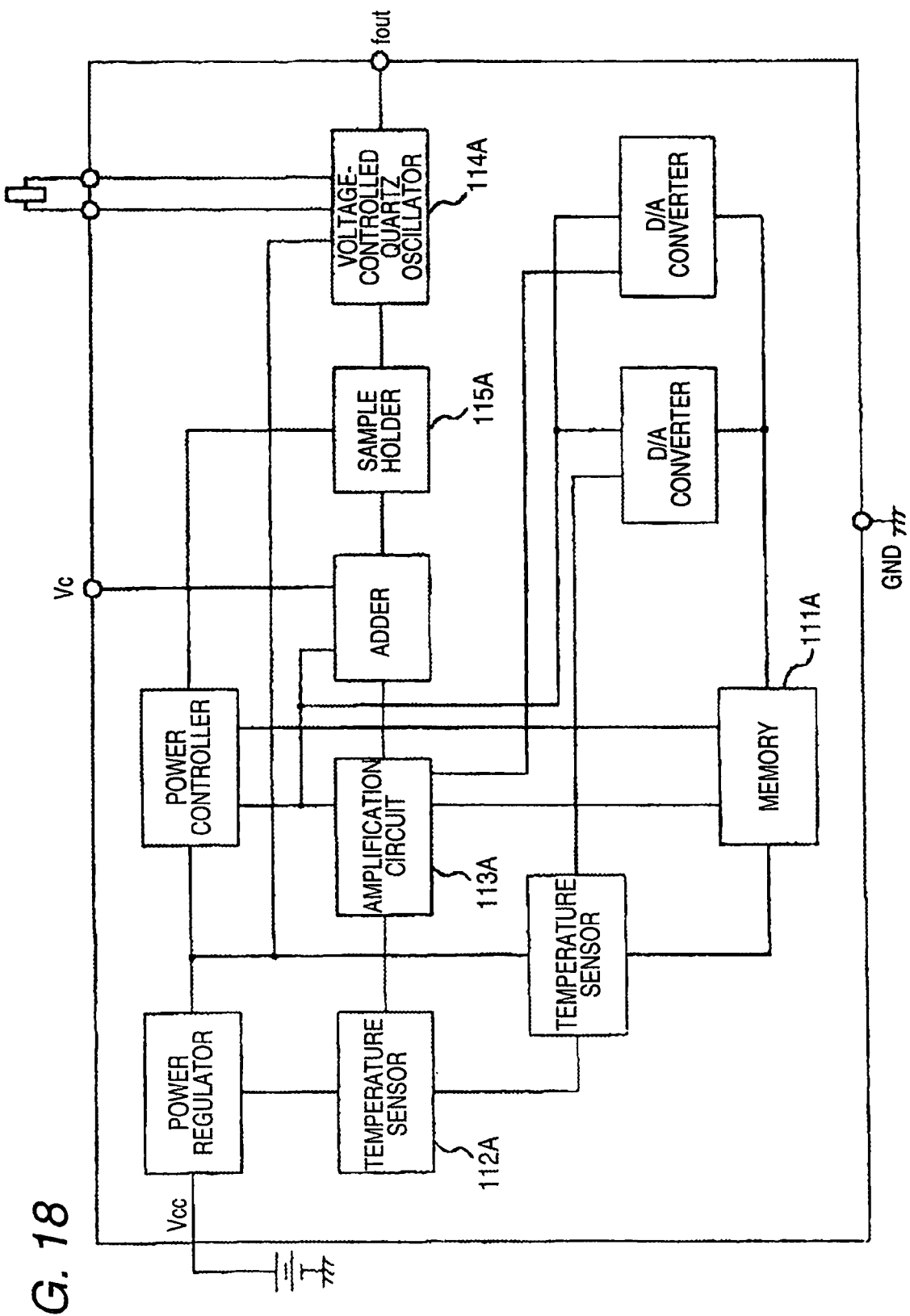
FIG. 18 is a block diagram showing the arrangement of a conventional quartz oscillation apparatus equipped with a temperature compensation function.

FIG. 16 is a diagram showing an example n-th order approximation function generation circuit for a function generation circuit according to a third embodiment of the present invention. When, as shown in FIG. 16B, three contiguous temperature domains TL1, TL2 and TL3 are arranged by dividing a low temperature area, an amplification circuit 162 generates a first order function control signal consonant with a first order temperature characteristic parameter for the domain TL1; an amplification circuit 163 generates a first order function control signal consonant with a first order temperature characteristic parameter for the domain TL2; and an amplification circuit 164 generates a first order function control signal consonant with a first order temperature characteristic parameter for the domain TL3.

When the control signals output by the amplification circuits 162, 163 and 164 are added together, a low-temperature side control signal VnL, of a control signal Vn that approximates the n-th order approximation function, can be obtained.

When a switch for varying a current mirror ratio is additionally provided for the amplification circuits 162, 163 and 164, the n-th order temperature characteristic parameter can be controlled.

The same structure is employed for a high temperature area. That is, three contiguous temperature domains TH1, TH2 and TH3 are arranged by dividing a high temperature area, a fourth amplification circuit generates a first order function control signal consonant with a first order temperature characteristic parameter for the domain TH1; a fifth amplification circuit generates a first order function control signal consonant with a first order temperature characteristic parameter for the domain TH2; and a sixth amplification circuit generates a first order function control signal consonant with a first order temperature characteristic parameter for the domain TH3.

When the control signals output by the fourth, fifth and sixth amplification circuits are added together, a high temperature area control signal VnH, of the control signal Vn that approximates the n-th order approximation function, can be obtained.

As described above, according to the function generation circuit of the third embodiment of the present invention, a TCXO that performs accurate temperature compensation within a broad temperature area can be provided, without degrading the noise condition near the normal temperature.

The function generation circuit of the invention provides effects that ensure accurate temperature compensation can be performed with less noise, and is useful for a noiseless TCXO having a high temperature compensation accuracy.

What is claimed is:

1. A function generation circuit, which performs temperature compensation for a quartz oscillation apparatus, comprising:

a first analog signal generation circuit, for generating and outputting a predetermined analog signal that is not affected by an ambient temperature;

a second analog signal generation circuit, for generating and outputting an analog signal that is affected by the ambient temperature and that approximates a first order function;

a third order approximation function generation circuit, for receiving the analog signals from the first analog signal generation circuit and the second analog signal generation circuit, and for generating and outputting m control signals (m is an integer of three or greater) corresponding to m contiguous temperature domains that are obtained by dividing a range, available for the ambient temperature, extending from a low temperature side to a high temperature side;

a first order function generation circuit, for receiving the analog signal from the second analog signal generation circuit and generating a first order function control signal that is affected by the ambient temperature;

a zero-th order function generation circuit, for receiving the analog signal generation circuit from the first analog signal generation circuit and generating a zero-th order function control signal that is not affected by the ambient temperature;

a fourth order and fifth order approximation function generation circuit, for employing a g-th control signal (g is an integer of one or greater and m or smaller) and a h-th control signal (h is an integer, other than g, of one or greater and m or smaller), both of which are output by the third order approximation function generation circuit in consonance with a g-th temperature domain and an h-th temperature domain, respectively, and generating control signals that approximate a fourth order function and a fifth order function; and an adder, for synthesizing the signal output by the third order approximation function generation circuit, the analog signal output by the first order function generation circuit, the zero-th order function control signal output by the zero-th order function generation circuit, and the control signals output by the fourth order and the fifth order approximation function generation circuit, and outputting the resultant signal.

2. The function generation circuit according to claim 1, wherein the second analog signal to be output by the second analog signal generation circuit is generated using a forward-directional voltage of a diode.

3. The function generation circuit according to claim 1, wherein the second analog signal to be output by the second analog signal generation circuit is generated using a temperature coefficient difference between a first resistor group and a second resistor group.

4. The function generation circuit according to claim 1, further comprising:

a peak change point adjustment circuit, for receiving the analog signal from the second analog signal generation circuit and for adjusting a temperature at a peak change point and outputting the result to the third order approximation function generation circuit and the first order function generation circuit.

5. A function generation circuit, which performs temperature compensation for a quartz oscillation apparatus, comprising:

a first analog signal generation circuit, for generating and outputting a predetermined analog signal that is not affected by an ambient temperature;

a second analog signal generation circuit, for generating and outputting an analog signal that is affected by the ambient temperature and is to approximate a first order function;

a third order approximation function generation circuit, for receiving analog signals from the first analog signal generation circuit and the second analog signal generation circuit, and for outputting a signal;

a first order function generation circuit, for receiving the analog signal from the second analog signal generation circuit, and generating a first order function control signal that is affected by the ambient temperature;

a zero-th order function generation circuit, for receiving the analog signal generation circuit from the first analog signal generation circuit and generating a zero-th order function control signal that is not affected by the ambient temperature;

an n-th order function approximation function generation circuit (n is an integer of four or greater), for receiving signals from the second analog signal generation circuit, and for generating and outputting the low temperature domain control signal corresponding to a low temperature domain;

an adder, for synthesizing the signals output by the third order approximation function generation circuit, the first order function generation circuit, the zero-order function generation circuit and the n-th order approximation function generation circuit.

6. The function generation circuit according to claim 5, wherein the second analog signal to be output by the second analog signal generation circuit is generated using a forward-directional voltage of a diode.

7. The function generation circuit according to claim 5, wherein the second analog signal to be output by the second analog signal generation circuit is generated using a temperature coefficient difference between a first resistor group and a second resistor group.

8. A function generation circuit according to claim 5, wherein the third order approximation function generation circuit receives signals from the first analog signal generation circuit and the second analog signal generation circuit, and generates and outputs m control signals that are consonant with m contiguous temperature domains obtained by dividing a range, available for the ambient temperature, from a low temperature side to a high temperature side.

9. The function generation circuit according to claim 5, further comprising:

a first peak change point adjustment circuit for receiving the analog signal from the second analog signal generation circuit and adjusting a temperature at a peak change point, and for outputting the result to the third order approximation function generation circuit and the first order function generation circuit;

a low temperature operating domain adjustment circuit, for receiving the analog signal from the second analog signal generation circuit, and for adjusting an operating temperature domain for a low temperature domain control circuit that outputs a low temperature domain control signal corresponding to a low temperature domain; and a high temperature operating adjustment circuit, for adjusting an operating temperature domain for a high temperature domain control circuit that outputs a high temperature domain control signal corresponding to a high temperature domain.

10. The function generation circuit according to claim 9, wherein the n-th order function approximation function generation circuit (n is an integer of four or greater) is for receiving signals from the low temperature operating domain adjustment circuit, the high temperature operating domain adjustment circuit and the second analog signal generation circuit; and for generating and outputting the low temperature domain control signal corresponding to the low temperature domain and the high temperature domain control signal corresponding to a high temperature domain.

11. The function generation circuit according to claim 5, further comprising:

a first peak change point adjustment circuit, for receiving the analog signal from the second analog signal generation circuit, adjusting a temperature at a peak change point and outputting a signal to the n-th order approximation function generation circuit.

12. A function generation circuit, which performs temperature compensation for a quartz oscillation apparatus, comprising:

a first analog signal generation circuit, for generating and outputting a predetermined analog signal that is not affected by an ambient temperature;

a second analog signal generation circuit, for generating and outputting an analog signal that is affected by the ambient temperature and that is to approximate a first order function;

a third order approximation function generation circuit, for receiving analog signals from the first analog signal generation circuit and the second analog signal generation circuit, and for outputting a signal;

a first order function generation circuit, for receiving the analog signal from the second analog signal generation circuit and generating a first order function control signal that is affected by the ambient temperature;

a zero-th order function generation circuit, for receiving the analog signal generation circuit from the first analog signal generation circuit and generating a zero-th order function control signal that is not affected by the ambient temperature;

an n-th order approximation function generation circuit (n is an integer of four or greater), for receiving signals from the second analog signal generation circuit, and for generating and outputting s low temperature domain control signals (s is an integer of two or greater) and t high temperature domain control signals (t is an integer of two or greater), which correspond respectively to s contiguous temperature domains and t contiguous temperature domains that are obtained by dividing a low temperature range and a high temperature range available for the ambient temperature;

an adder, for synthesizing the signals output by the third order approximation function generation circuit, the first order function generation circuit, the zero-th order function generation circuit and the n-th order approximation function generation circuit.

13. The function generation circuit according to claim 12, wherein the second analog signal to be output by the second analog signal generation circuit is generated using a forward-directional voltage of a diode.

14. The function generation circuit according to claim 12, wherein the second analog signal to be output by the second analog signal generation circuit is generated using a temperature coefficient difference between a first resistor group and a second resistor group.

15. The function generation circuit according to claim 12, further comprising:

a first peak change point adjustment circuit for receiving the analog signal from the second analog signal generation circuit, adjusting a temperature at a peak change point, and outputting the result to the third order approximation function generation circuit and the first order function generation circuit;

a low temperature operating domain adjustment circuit, for receiving the analog signal from the second analog signal generation circuit and for adjusting an operating temperature domain for a low temperature domain control circuit that outputs a low temperature domain control signal corresponding to a low temperature domain; and a high temperature operating adjustment circuit, for adjusting an operating temperature domain for a high temperature domain control circuit that outputs a high temperature domain control signal corresponding to a high temperature domain.

16. The function generation circuit according to claim 15, wherein the n-th approximation function generation circuit (n is an integer of four or greater) is for receiving signals from the low temperature operating domain adjustment circuit, the high temperature operating domain adjustment circuit and the second analog signal generation circuit.

17. The function generation circuit according to claim 12, further comprising:

a first peak change point adjustment circuit, for receiving the analog signal from the second analog signal generation circuit, adjusting a peak change point and outputting a signal to the n-th order approximation function generation circuit.

* * * * *